(12) United States Patent
Noda

(10) Patent No.: US 10,811,540 B2
(45) Date of Patent: Oct. 20, 2020

(54) SEMICONDUCTOR DEVICE AND ELECTRONIC DEVICE

(71) Applicant: SEMICONDUCTOR ENERGY LABORATORY CO., LTD., Atsugi-shi, Kanagawa-ken (JP)

(72) Inventor: Kosei Noda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/367,340

(22) Filed: Mar. 28, 2019

(65) Prior Publication Data

US 2019/0221670 A1  Jul. 18, 2019

Related U.S. Application Data

(63) Continuation of application No. 14/941,854, filed on Nov. 16, 2015, now Pat. No. 10,249,765.

(30) Foreign Application Priority Data

Nov. 21, 2014 (JP) .................... 2014-236230

(51) Int. Cl.
    *H01L 29/786* (2006.01)
    *H01L 27/06* (2006.01)
    (Continued)

(52) U.S. Cl.
    CPC ...... *H01L 29/7869* (2013.01); *H01L 21/8258* (2013.01); *H01L 27/0688* (2013.01);
    (Continued)

(58) Field of Classification Search
    CPC ........... H01L 21/7687; H01L 23/49589; H01L 23/5223; H01L 27/0288;
    (Continued)

(56) References Cited

U.S. PATENT DOCUMENTS 5,405,799 A    4/1995    Woo et al.
5,561,310 A    10/1996    Woo et al.
(Continued)

FOREIGN PATENT DOCUMENTS

CN    102725841 A    10/2012
EP    1737044 A    12/2006
(Continued)

OTHER PUBLICATIONS

Brain.R et al., "A 22nm High Performance Embedded DRAM SoC Technology Featuring Tri-gate Transistors and MIMCAP COB", 2013 Symposium on VLSI Technology : Digest of Technical Papers, Jun. 11, 2013, pp. T16-T17.
(Continued)

*Primary Examiner* — Cuong B Nguyen
(74) *Attorney, Agent, or Firm* — Fish & Richardson P.C.

(57) ABSTRACT

To provide a highly reliable semiconductor device that is suitable for miniaturization and higher density. A semiconductor device includes a first electrode including a protruding portion, a first insulator over the protruding portion, a second insulator covering the first electrode and the first insulator, and a second electrode over the second insulator. The second electrode includes a first region which overlaps with the first electrode with the first insulator and the second insulator provided therebetween and a second region which overlaps with the first electrode with the second insulator provided therebetween. The peripheral portion of the second electrode is provided in the first region.

16 Claims, 32 Drawing Sheets

(51) Int. Cl.
  *H01L 49/02* (2006.01)
  *H01L 21/8258* (2006.01)
  *H01L 29/78* (2006.01)
  *H01L 27/12* (2006.01)
  *H01L 29/417* (2006.01)
  *H01L 29/423* (2006.01)
  *H01L 27/1156* (2017.01)

(52) U.S. Cl.
  CPC ...... *H01L 27/1207* (2013.01); *H01L 27/1225* (2013.01); *H01L 27/1255* (2013.01); *H01L 28/90* (2013.01); *H01L 29/41733* (2013.01); *H01L 29/42384* (2013.01); *H01L 29/785* (2013.01); *H01L 29/78603* (2013.01); *H01L 29/78696* (2013.01); *H01L 27/1156* (2013.01)

(58) Field of Classification Search
  CPC ..... H01L 27/0629–0805; H01L 27/101; H01L 27/10811–1082; H01L 27/10829–10861; H01L 28/40; H01L 29/66174; H01L 29/7869; H01L 21/8258; H01L 28/90; H01L 29/78603; H01L 29/41733; H01L 29/42384; H01L 27/1156
  See application file for complete search history.

(56) References Cited

U.S. PATENT DOCUMENTS

| | | |
|---|---|---|
| 5,650,351 A | 7/1997 | Wu |
| 5,731,856 A | 3/1998 | Kim et al. |
| 5,744,864 A | 4/1998 | Cillessen et al. |
| 6,294,274 B1 | 9/2001 | Kawazoe et al. |
| 6,387,750 B1 | 5/2002 | Lai et al. |
| 6,563,174 B2 | 5/2003 | Kawasaki et al. |
| 6,717,196 B2 | 4/2004 | Joo |
| 6,727,522 B1 | 4/2004 | Kawasaki et al. |
| 6,887,720 B2 | 5/2005 | Joo |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,741,222 B2 | 6/2010 | You et al. |
| 8,253,178 B1 | 8/2012 | Yang et al. |
| 8,445,951 B2 | 5/2013 | Furuta et al. |
| 8,809,853 B2 | 8/2014 | Saito et al. |
| 8,866,233 B2 | 10/2014 | Yamazaki |
| 9,007,093 B2 | 4/2015 | Kurokawa et al. |
| 9,356,601 B2 | 5/2016 | Kurokawa et al. |
| 9,680,476 B2 | 6/2017 | Kurokawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047764 A1 | 3/2003 | Joo |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0050874 A1 | 2/2008 | Won et al. |
| 2008/0061371 A1* | 3/2008 | Kang ................ H01L 21/8221 257/351 |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0213520 A1 | 8/2010 | Furuta et al. |
| 2011/0045650 A1 | 2/2011 | Maekawa |
| 2011/0175104 A1 | 7/2011 | Yamazaki |
| 2011/0237044 A1 | 9/2011 | Yun |
| 2012/0223306 A1 | 9/2012 | Saito et al. |
| 2012/0228688 A1 | 9/2012 | Matsubayashi |
| 2013/0207112 A1 | 8/2013 | Isobe et al. |
| 2013/0250477 A1 | 9/2013 | Lim |
| 2015/0187775 A1 | 7/2015 | Yamamoto et al. |
| 2015/0270288 A1 | 9/2015 | Yamazaki et al. |
| 2016/0079354 A1 | 3/2016 | Park et al. |
| 2016/0247929 A1 | 8/2016 | Noda |

(56) References Cited

U.S. PATENT DOCUMENTS

FOREIGN PATENT DOCUMENTS

| EP | 2226847 A | 9/2010 |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-026156 A | 1/1992 |
| JP | 05-110026 A | 4/1993 |
| JP | 05-251705 A | 9/1993 |
| JP | 06-216340 A | 8/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-189435 A | 7/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-163329 A | 6/2003 |
| JP | 2004-103957 A | 4/2004 |
| JP | 2004-273614 A | 9/2004 |
| JP | 2004-273732 A | 9/2004 |
| JP | 2004-288731 A | 10/2004 |
| JP | 2006-114896 A | 4/2006 |
| JP | 2006-186320 A | 7/2006 |
| JP | 2007-096055 A | 4/2007 |
| JP | 2007-123861 A | 5/2007 |
| JP | 2008-177225 A | 7/2008 |
| JP | 2010-199161 A | 9/2010 |
| JP | 2011-049321 A | 3/2011 |
| JP | 2011-166130 A | 8/2011 |
| JP | 2012-199528 A | 10/2012 |
| JP | 2014-007737 A | 1/2014 |
| KR | 1996-0005246 | 4/1996 |
| KR | 2012-0125272 A | 11/2012 |
| TW | 201143027 | 12/2011 |
| TW | 201310627 | 3/2013 |
| WO | WO-2004/114391 | 12/2004 |
| WO | WO-2011/086812 | 7/2011 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO

(56) References Cited

OTHER PUBLICATIONS

Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for white tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs with a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.

(56) References Cited

OTHER PUBLICATIONS

Ueno.K et al., "Field-Effect Transistor on SrTiO3 with Sputtered Al2O3 Gate Insulator" Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/IB2015/058626) dated Mar. 8, 2016.
Written Opinion (Application No. PCT/IB2015/058626) dated Mar. 8, 2016.

\* cited by examiner

SEMICONDUCTOR DEVICE AND ELECTRONIC DEVICE

CROSS-REFERENCE TO RELATED APPLICATIONS

This application is a continuation of U.S. application Ser. No. 14/941,854, filed Nov. 16, 2015, now allowed, which claims the benefit of a foreign priority application filed in Japan as Serial No. 2014-236230 on Nov. 21, 2014, both of which are incorporated by reference.

TECHNICAL FIELD

One embodiment of the present invention relates to a capacitor and a semiconductor device including the capacitor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are embodiments of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

A technique in which a transistor is formed using a semiconductor material has attracted attention. The transistor is applied to a wide range of electronic devices, such as integrated circuits (ICs) or image display devices (also simply referred to as display devices). A silicon-based semiconductor material is widely known as a semiconductor material applicable to the transistor. As another material, an oxide semiconductor has attracted attention.

For example, a technique in which a transistor is formed using zinc oxide or an In—Ga—Zn-based oxide as an oxide semiconductor is disclosed (see Patent Documents 1 and 2).

In addition, in recent years, a demand for an integrated circuit in which semiconductor elements, such as miniaturized transistors, are integrated with high density has grown, with increased performance and reductions in size and weight of electronic devices. For example, a tri-gate transistor and a capacitor-over-bitline (COB) MIM capacitor are reported (Non-Patent Document 1).

REFERENCE

Patent Document

[Patent Document 1] Japanese Published Patent Application No. 2007-123861

[Patent Document 2] Japanese Published Patent Application No. 2007-096055

Non-Patent Document

Non-Patent Document 1

R. Brain et al., "A 22 nm High Performance Embedded DRAM SoC Technology Featuring Tri-gate Transistors and MIMCAP COB", 2013 SYMPOSIUM ON VLSI TECHNOLOGY: DIGEST OF TECHNICAL PAPERS, 2013, pp. T16-T17

DISCLOSURE OF INVENTION

An object of one embodiment of the present invention is to provide a semiconductor device that is suitable for miniaturization and higher density.

Another object of one embodiment of the present invention is to provide a semiconductor device with favorable electrical characteristics. Another object of one embodiment of the present invention is to provide a highly reliable semiconductor device.

Another object of one embodiment of the present invention is to provide a semiconductor device with a novel structure.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention includes a first electrode including a protruding portion, a first insulator over the protruding portion, a second insulator covering the first electrode and the first insulator, and a second electrode over the second insulator. The peripheral portion of the second electrode includes a region which overlaps with the first electrode with the first insulator and the second insulator provided therebetween.

Note that "peripheral portion" means a region including an edge along the side surface of an object. In particular, in the structure including a capacitor in this specification, the "peripheral portion" means a region at the edge of an object, which can generate leakage current (edge leakage current). For example, the peripheral portion of the second electrode means a region including an edge of the second electrode. Between the region and the first electrode, leakage current can be generated.

One embodiment of the present invention includes a first electrode including a protruding portion, a first insulator over the protruding portion, a second insulator covering the first electrode and the first insulator, and a second electrode over the second insulator. The second electrode includes a first region which overlaps with the first electrode with the first insulator and the second insulator provided therebetween and a second region which overlaps with the first electrode with the second insulator provided therebetween. The peripheral portion of the second electrode is provided in the first region.

In the above structure, the first electrode is electrically connected to a transistor.

In the above structure, the transistor includes a third electrode, and the third electrode is provided in a conductor that is also used for the first electrode.

One embodiment of the present invention is an electronic device including the above structure and at least one of a display device, a microphone, a speaker, an operation key, a touch panel, and an antenna.

In accordance with one embodiment of the present invention, a semiconductor device that is suitable for miniaturization and higher density can be provided.

In addition, a semiconductor device with favorable electrical characteristics can be provided. In addition, a highly reliable semiconductor device can be provided. In addition, a semiconductor device with a novel structure can be provided. Note that the description of these effects does not disturb the existence of other effects. One embodiment of the present invention does not necessarily achieve all the effects listed above. Other effects will be apparent from and can be derived from the description of the specification, the drawings, the claims, and the like.

BEST MODE FOR CARRYING OUT THE INVENTION

Figure 1A:
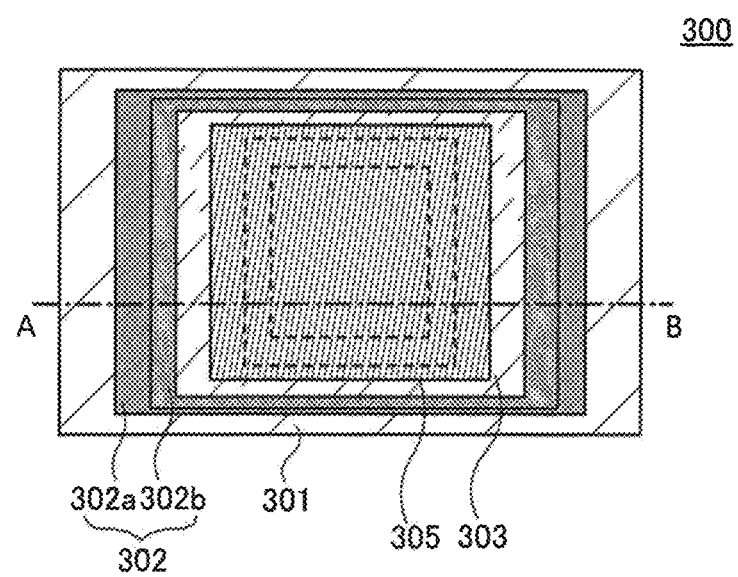
FIGS. 1A and 1B illustrate a top view structure and a cross-sectional structure, respectively, of a capacitor of one embodiment.

Embodiments will be described in detail with reference to the drawings. Note that the present invention is not limited to the following description, and it will be easily understood by those skilled in the art that modes and details thereof can be variously changed without departing from the spirit and the scope of the present invention. Accordingly, the present invention should not be interpreted as being limited to the content of the embodiments below.

In the structures of the invention described below, the same portions or portions having similar functions are denoted by the same reference numerals in different drawings, and repetitive description thereof will be omitted. Furthermore, the same hatching pattern is applied to portions having similar functions, and the portions are not especially denoted by reference numerals in some cases.

In each drawing described in this specification, the size, the layer thickness, or the region of each component is exaggerated for clarity in some cases. Therefore, embodiments of the present invention are not limited to such a scale.

In this specification and the like, ordinal numbers, such as "first" and "second", are used in order to avoid confusion among components and do not limit the components numerically.

A transistor is a kind of semiconductor element and can achieve amplification of current or voltage, the switching operation for controlling conduction or non-conduction, and the like. A transistor in this specification includes an insulated-gate field-effect transistor (IGFET) and a thin film transistor (TFT).

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

Structural Example

Figure 1B:
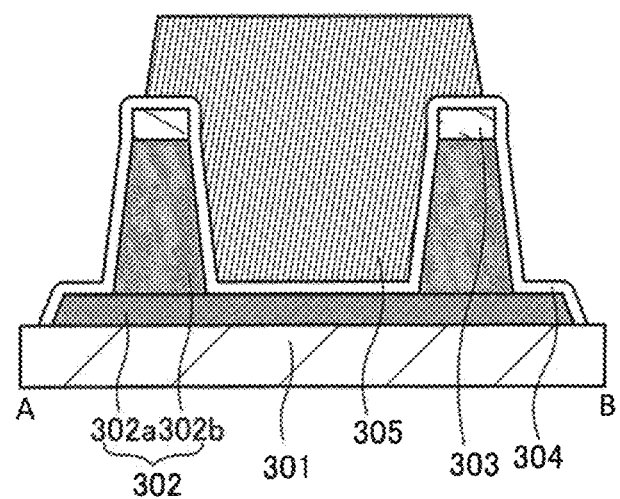

FIG. 1A is an example of a top view of a capacitor 300. FIG. 1B is a cross-sectional view along dashed-dotted line A-B in FIG. 1A.

The capacitor 300 is provided over an insulating film 301 and includes a first electrode 302 including conductive layers 302a and 302b, a barrier layer 303, an insulator 304, and a second electrode 305.

The conductive layers 302a and 302b can each be formed using a conductive material, such as a metal material, an alloy material, or a metal oxide material. It is preferable to use a high-melting-point material which has both heat resistance and conductivity, such as tungsten or molybdenum, and it is particularly preferable to use tungsten. The conductive layers 302a and 302b may be formed using the same material or different materials from each other.

The conductive layer 302b is formed over the conductive layer 302a such that part of the conductive layer 302a is exposed; in such a manner, the first electrode 302 has unevenness on its surface. Although the first electrode 302 having unevenness is formed using the conductive layers 302a and 302b, it may be formed by patterning one conductive layer or three or more conductive layers that are stacked. What is needed is that the conductive layer 302b is at least provided in a region that overlaps with the peripheral portion of the second electrode 305, and an optimal shape of the conductive layer 302b may be designed as appropriate. For example, FIGS. 1A and 1B illustrate an example in which the conductive layer 302b has a quadrangular island shape having an opening; however, the conductive layer 302b may have a polygonal or circular shape.

The barrier layer 303 is provided over the conductive layer 302b. With the barrier layer 303, the capacitor 300 can have fewer defects in shape. As the barrier layer 303, an insulating film, such as a silicon oxide film or a gallium oxide film, or a semiconductor film, such as an oxide semiconductor film, can be used.

The insulator 304 is provided so as to cover the conductive layers 302a and 302b and the barrier layer 303. The insulator 304 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like.

The second electrode 305 is provided over the first electrode 302 with the barrier layer 303 and the insulator 304 provided therebetween. The second electrode 305 can be formed using a conductive material, such as a metal material, an alloy material, or a metal oxide material. It is preferable to use a high-melting-point material which has both heat resistance and conductivity, such as tungsten or molybdenum, and it is particularly preferable to use tungsten.

Note that the second electrode 305 is provided such that its peripheral portion overlaps with the conductive layer 302b with the barrier layer 303 and the insulator 304 provided therebetween.

In the capacitor 300, the peripheral portion of the second electrode 305 overlaps with the conductive layer 302b with the barrier layer 303 provided therebetween. Therefore, in the peripheral portion, the distance between the second electrode 305 and the first electrode 302 is longer than that in other regions by at least the thickness of the barrier layer 303. This allows the capacitor 300 of one embodiment of the present invention to have fewer defects in shape and to be highly reliable.

With the first electrode 302 having unevenness, the capacitor 300 can be three-dimensional. Accordingly, the capacitance of the capacitor per projected area can be increased, leading to a smaller area, higher integration, and miniaturization of a semiconductor device.

The above is the description of the structural example.

Application Example 1

Figure 2A:
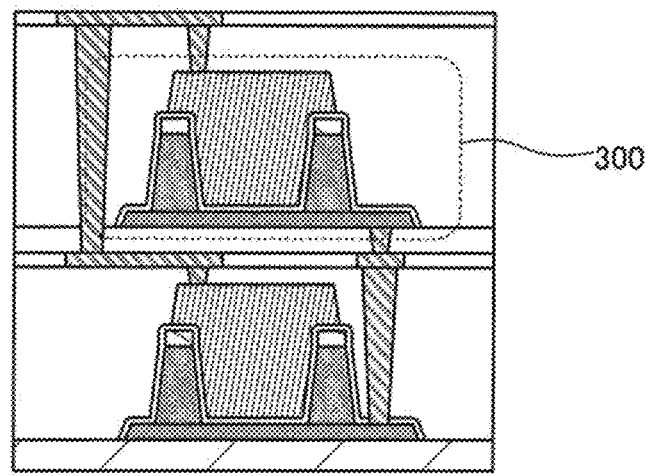
FIGS. 2A and 2B each illustrate a cross-sectional structure of a capacitor of one embodiment.
Figure 2B:
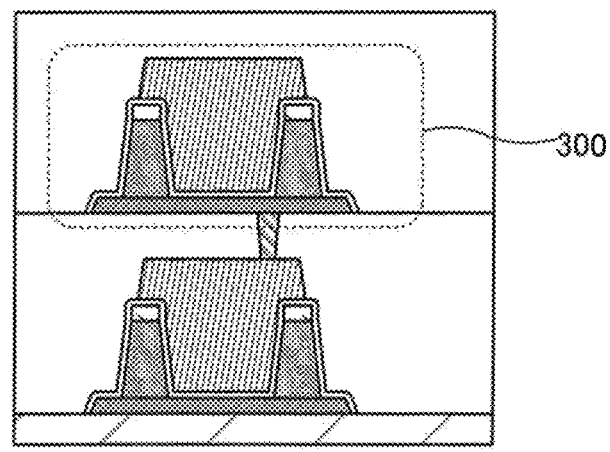

As an application example of this embodiment, a plurality of capacitors 300 can be stacked as illustrated in FIGS. 2A and 2B. The capacitors 300 are connected in parallel in FIG. 2A, whereas the capacitors 300 are connected in series in FIG. 2B. Although two capacitors 300 are stacked in FIGS. 2A and 2B, three or more capacitors 300 can be stacked as necessary.

With the above structure, a three-dimensional capacitor can be formed. Accordingly, the capacitance of the capacitor per projected area can be increased, leading to a smaller area, higher integration, and miniaturization of a semiconductor device.

Modification Example 1

Figure 3A:
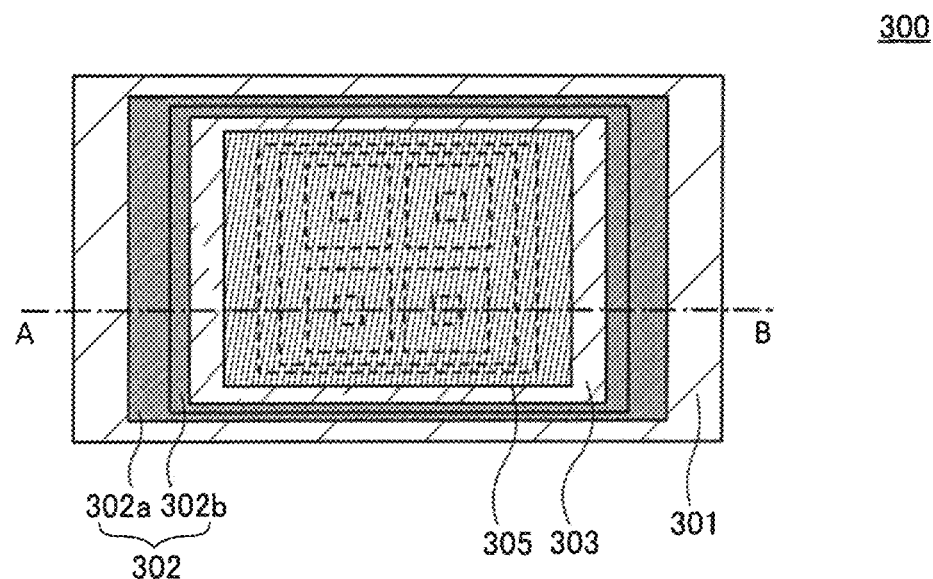
FIGS. 3A and 3B illustrate a top view structure and a cross-sectional structure, respectively, of a capacitor of one embodiment.
Figure 3B:
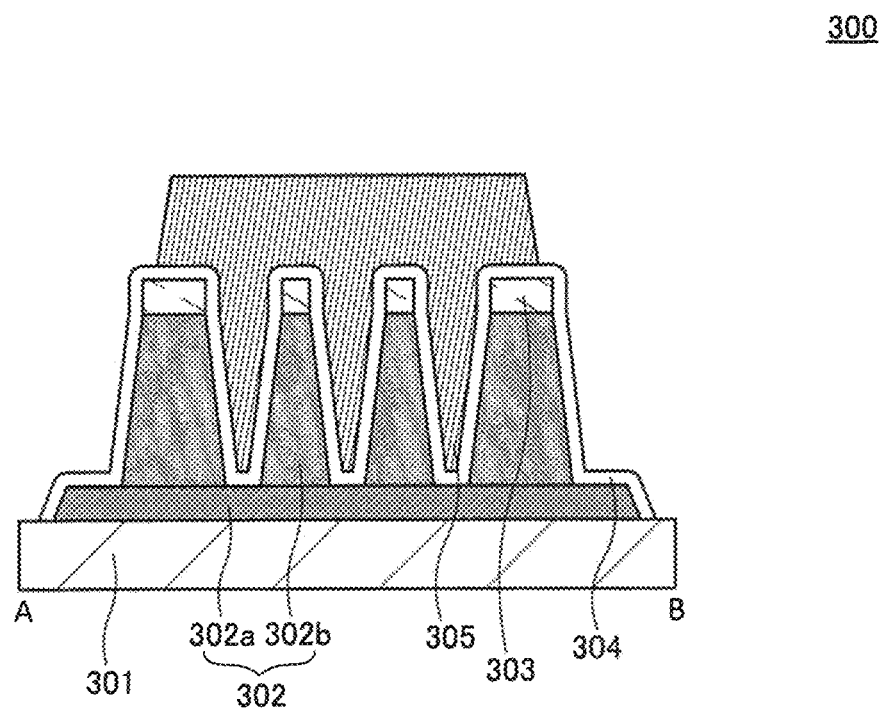

As a modification example of this embodiment, as illustrated in FIGS. 3A and 3B, a protruding portion formed using the conductive layer 302b may also be provided in a groove of the first electrode 302 of the capacitor 300. An optimal shape of the protruding portion may be designed as appropriate. For example, in addition to a stripe (grid) shape, a truncated quadrangular pyramid shape, a truncated polygonal pyramid shape, a truncated conical shape, a polygonal prism shape, or a cylinder shape may be used as long as it is an island shape. In addition, the protruding portion is not necessarily arranged regularly and may be arranged irregularly.

With the protruding portion, the capacitance of the capacitor per projected area can be further increased, leading to a smaller area, higher integration, and miniaturization of a semiconductor device.

[Example of Manufacturing Method]

An example of a method for manufacturing the capacitor illustrated in FIGS. 3A and 3B will be described below with reference to FIGS. 4A to 4E, FIGS. 5A to 5D, and FIGS. 6A to 6D.

Figure 4A:
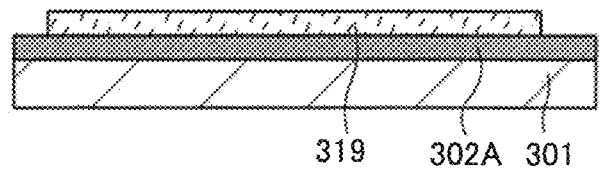
FIGS. 4A to 4E illustrate an example of a method for manufacturing a capacitor of one embodiment.

First, a conductive film 302A is formed over the insulating film 301 (FIG. 4A). The insulating film 301 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like.

The insulating film 301 can be formed by a sputtering method, a CVD method (including a thermal CVD method, an MOCVD method, a PECVD method, and the like), an MBE method, an ALD method, a PLD method, or the like. In particular, it is preferable that the insulating film 301 be formed by a CVD method, more preferably, a plasma CVD method because coverage can be improved. It is preferable to use a thermal CVD method, an MOCVD method, or an ALD method in order to reduce plasma damage.

It is preferable that the conductive film 302A be formed using a metal selected from tantalum, tungsten, titanium, molybdenum, chromium, niobium, and the like, or an alloy material or a compound material containing any of the metals as its main component. Alternatively, polycrystalline silicon to which an impurity, such as phosphorus, is added can be used. Alternatively, a stacked-layer structure including a metal nitride film and a film of any of the above metals may be used. As a metal nitride, tungsten nitride, molybdenum nitride, or titanium nitride can be used. When the metal nitride film is provided, adhesiveness of the metal film can be increased; thus, separation can be prevented.

The conductive film 302A can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Figure 4B:
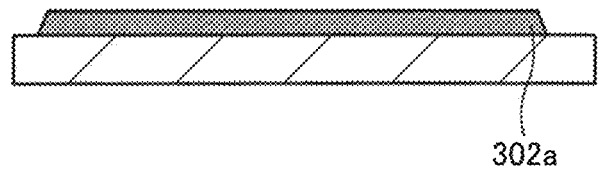

Next, a resist mask 319 is formed over the conductive film 302A by a lithography process or the like, and an unnecessary portion of the conductive film 302A is removed. After that, the resist mask 319 is removed. In this manner, the conductive layer 302a can be formed (FIG. 4B).

A method for processing a film is described. In the case of finely processing a film, a variety of fine processing techniques can be used. For example, a method may be used in which a resist mask formed by a lithography process or the like is subjected to slimming treatment. Alternatively, a dummy pattern is formed by a lithography process or the like, the dummy pattern is provided with a sidewall and then removed, and a film is etched using the remaining sidewall as a resist mask. To achieve a high aspect ratio, anisotropic dry etching is preferably used for etching of a film. Alternatively, a hard mask formed of an inorganic film or a metal film may be used.

As light used to form the resist mask, for example, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may also be performed by a liquid immersion exposure technique. As light for the exposure, extreme ultra-violet light (EUV) or X-rays may be used. Instead of the light for the exposure, an electron beam can be used. It is preferable to use extreme ultra-violet light (EUV), X-rays, or an electron beam because extremely fine processing can be performed. In the case of performing exposure by scanning of a beam, such as an electron beam, a photomask is not needed.

Before a resist film that is processed into the resist mask is formed, an organic resin film having a function of improving adhesion between a film and the resist film may be formed. The organic resin film can be formed by, for example, a spin coating method to planarize a surface by covering a step thereunder and thus can reduce variation in thickness of the resist mask over the organic resin film. In the case of fine processing, in particular, a material serving as an anti-reflection film against light for the exposure is preferably used for the organic resin film. Examples of such an organic resin film serving as an anti-reflection film include a bottom anti-reflection coating (BARC) film. The organic resin film may be removed at the same time as the removal of the resist mask or after the removal of the resist mask.

Figure 4C:
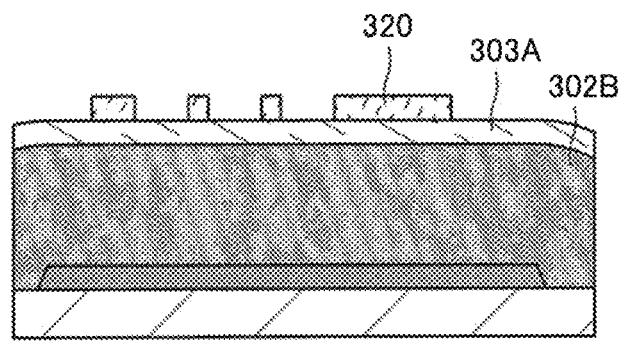

Next, a conductive film 302B and a barrier film 303A are formed over the conductive layer 302a. The conductive film 302B can be formed in a manner similar to that of the conductive film 302A. As the barrier film 303A, an insulating film, such as a silicon oxide film or a gallium oxide film, or a semiconductor film, such as an oxide semiconductor film, can be used (FIG. 4C).

The barrier film 303A can be formed by, for example, a sputtering method, a CVD method (including a thermal CVD method, an MOCVD method, a PECVD method, and the like), an MBE method, an ALD method, a PLD method, or the like. In particular, it is preferable that the barrier film 303A be formed by a CVD method, more preferably, a plasma CVD method because coverage can be improved. It is preferable to use a thermal CVD method, an MOCVD method, or an ALD method in order to reduce plasma damage.

Figure 4D:
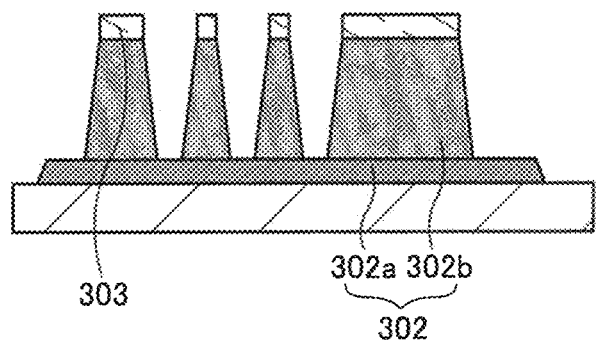

After that, a resist mask 320 is formed by a method similar to that described above, and unnecessary portions of the barrier film 303A and the conductive film 302B are removed by etching. Then, the resist mask 320 is removed, whereby the barrier layer 303 and the conductive layer 302b are formed (FIG. 4D). When the conductive layer 302b is formed, the first electrode 302 serving as one electrode of the capacitor 300 is completed.

The barrier film 303A and the conductive film 302B may be etched separately. In that case, the barrier layer 303 is first formed using the resist mask 320, and then the barrier layer 303 is used as a hard mask to etch the conductive film 302B.

Figure 5A:
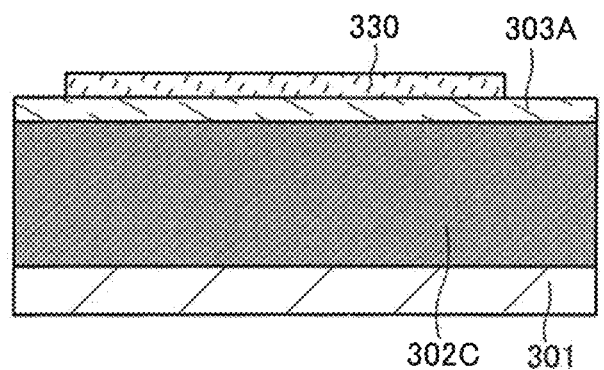
FIGS. 5A to 5D illustrate an example of a method for manufacturing a capacitor of one embodiment.
Figure 5B:
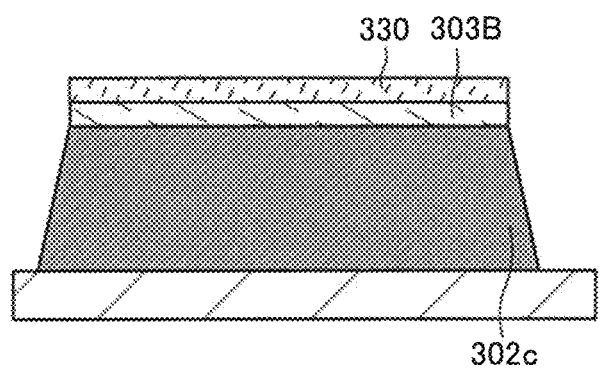
Figure 5C:
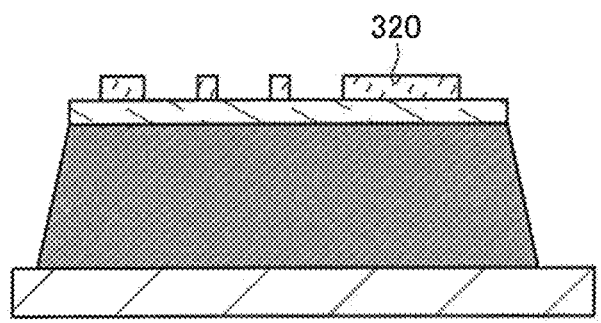
Figure 5D:
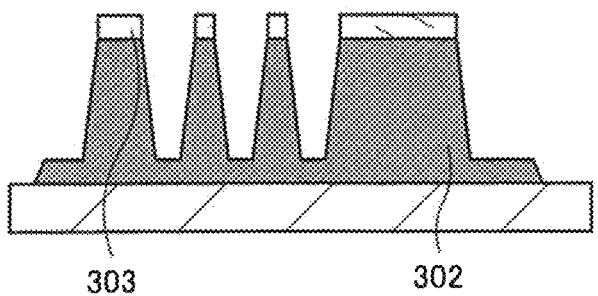

Alternatively, the first electrode 302 including a protruding portion may be formed by processing one conductive film in such a manner that a barrier film is formed over a conductive film that is formed to be sufficiently thick. A technique, such as half etching, can be used for the processing. For example, as illustrated in FIGS. 5A and 5B, a resist mask 330 is formed over the barrier film 303A and a conductive film 302C that is formed to be sufficiently thick, and processing is performed to form a barrier film 303B and a conductive film 302c. After that, as illustrated in FIGS. 5C and 5D, the resist mask 320 is formed, and part of the barrier film 303B and part of the conductive film 302c are removed. The conductive film 302c may be processed by timer etching in which the processing time corresponding to a desired etching amount is calculated from the etching rate of the conductive film 302C and etching is stopped during the process using a timer. In this manner, the first electrode 302 can include a protruding portion as illustrated in FIG. 5D.

When an exposure method using an exposure mask including a semi-transmission portion, which is referred to as a half-tone exposure method, is used, the first electrode 302 can be formed using one mask. Alternatively, a photo mask or a reticle provided with an auxiliary pattern having a function of reducing light intensity, which is formed of a diffraction grating pattern, may be used in a lithography process for forming the first electrode 302.

Figure 4E:
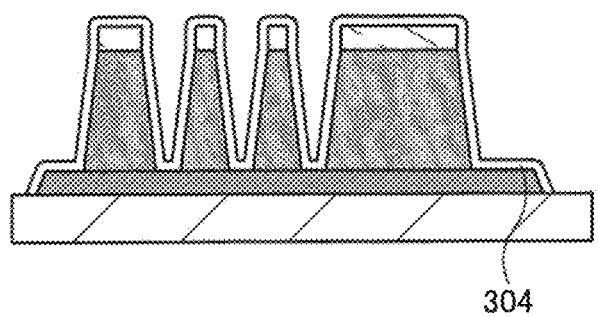

Next, the insulator 304 is formed over the first electrode 302 and the barrier layer 303 using a resist mask in a manner similar to that described above. The insulator 304 can be formed in a manner similar to that of the insulating film 301 (FIG. 4E).

Figure 6A:
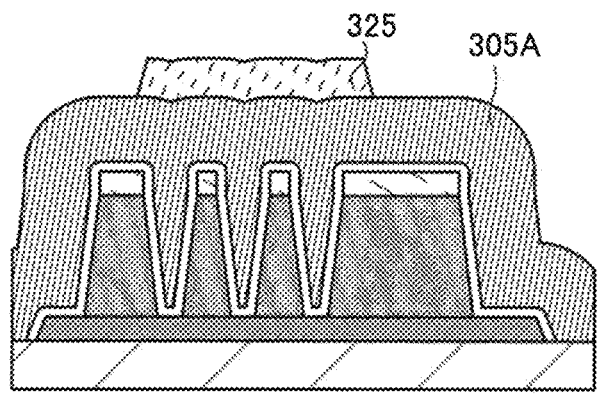
FIGS. 6A to 6D illustrate an example of a method for manufacturing a capacitor of one embodiment.
Figure 6B:
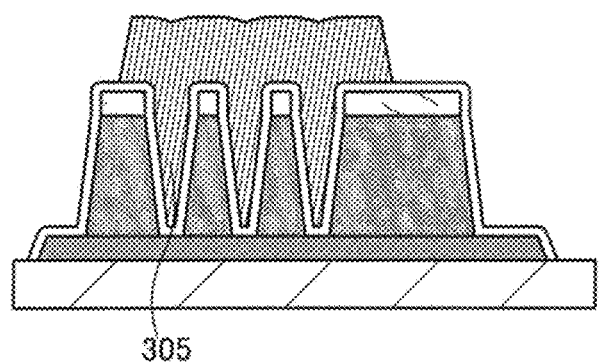

A conductive film 305A is formed over the insulator 304 (FIG. 6A). The conductive film 305A can be formed in a manner similar to that of the conductive film 302A. After that, a resist mask 325 is formed by a method similar to that described above, and an unnecessary portion of the conductive film 305A is removed by etching, whereby the second electrode 305 is formed. At this time, not only the conductive film 305A but also the surface of the insulator 304 is etched. Thus, the thickness of a region of the insulator 304 which does not overlaps with the second electrode 305 is smaller than that of a region of the insulator 304 which overlaps with the second electrode 305. Furthermore, the surface of the insulator 304 is damaged by being exposed to plasma in the case of dry etching or to an etchant or the like in the case of wet etching. Therefore, without the barrier layer 303, leakage current is likely to be generated in a region under the peripheral portion of the second electrode 305. With the barrier layer 303, the first electrode 302 and the second electrode 305 can be appropriately distanced from each other, leading to the capacitor 300 that is highly reliable, highly integrated, and miniaturized (FIG. 6B).

Figure 6C:
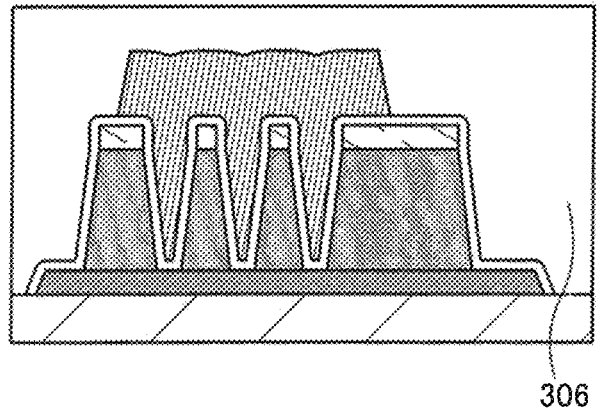

Then, an insulating film 306 that covers the capacitor 300 is formed. The insulating film 306 can be formed using a material and a method similar to those of the insulating film 301 and the like (FIG. 6C).

Figure 6D:
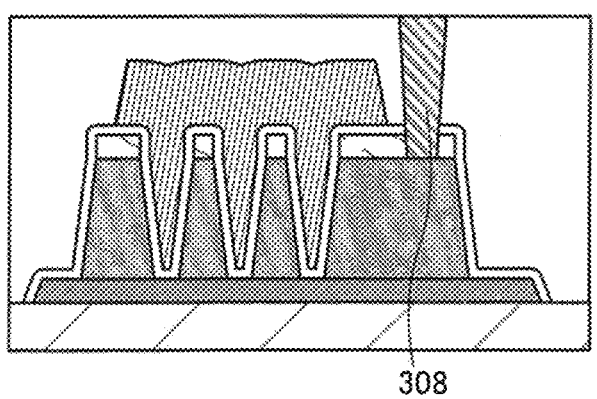

In addition, a wiring 308 may be formed so as to electrically connect the capacitor 300 to other semiconductor elements (FIG. 6D). The wiring 308 can be formed using a conductive material, such as a metal material, an alloy material, or a metal oxide material. In particular, the wiring 308 is preferably formed using a low-resistance conductive material, such as aluminum or copper. The use of the material as described above can reduce the wiring resistance.

Through the above steps, the capacitor of one embodiment of the present invention can be manufactured. The capacitor illustrated in FIGS. 1A and 1B can also be manufactured in a manner similar to that described above.

In this embodiment, one embodiment of the present invention is described. Other embodiments of the present invention are described in Embodiments 2 to 9. Note that one embodiment of the present invention is not limited to the above examples. In other words, various embodiments of the invention are described in this embodiment and other embodiments, and one embodiment of the present invention is not limited to a particular embodiment. For example, although an example in which the barrier layer is provided over the first electrode of the capacitor is described as one embodiment of the present invention, one embodiment of the present invention is not limited thereto. Depending on the case or circumstances, any of various layers may be provided over the first electrode of the capacitor in one embodiment of the present invention. Depending on the case or circumstances, a barrier layer is not necessarily provided over the first electrode of the capacitor in one embodiment of the present invention.

Embodiment 2

Structural Example

Figure 7A:
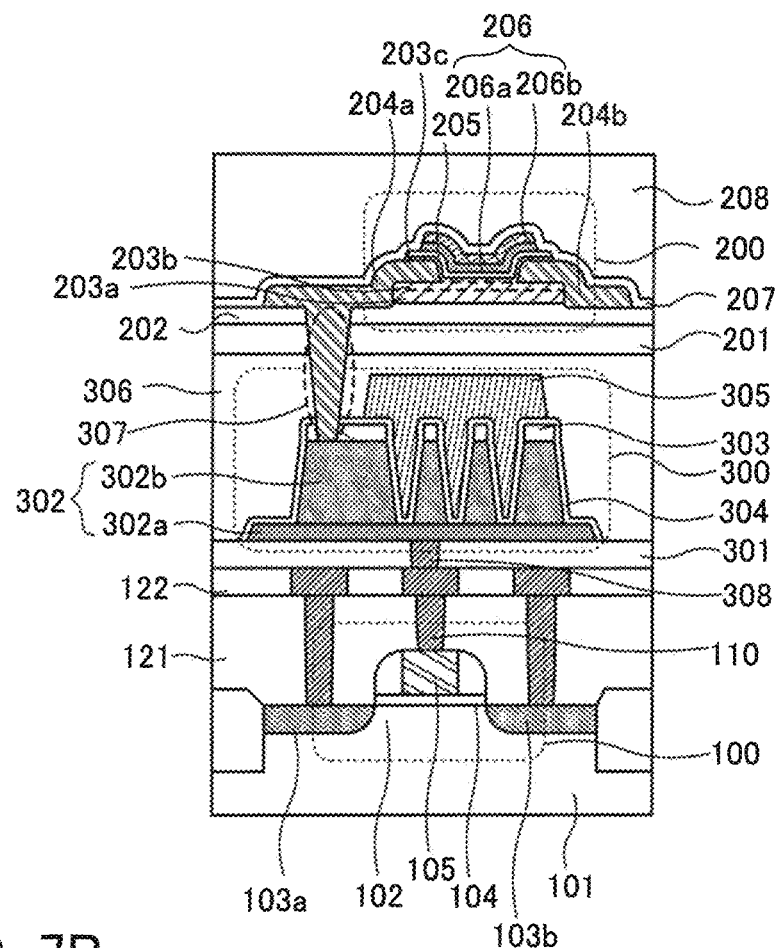
FIG. 7A illustrates a structural example and FIG. 7B is a circuit diagram of a semiconductor device of one embodiment.
Figure 7B:
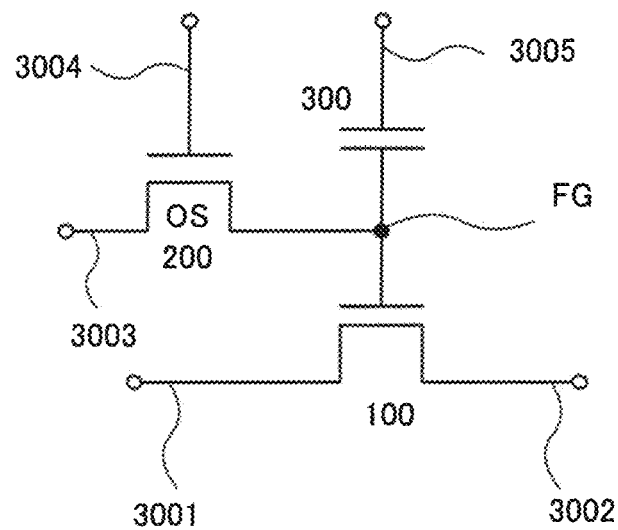

FIGS. 7A and 7B illustrate an example of a semiconductor device (memory device) in which the capacitor of one embodiment of the present invention is used. Note that FIG. 7B is a circuit diagram of the structure illustrated in FIG. 7A.

The semiconductor device illustrated in FIGS. 7A and 7B includes a first transistor 100, a second transistor 200, and a capacitor 300. The capacitor described in Embodiment 1 can be used as the capacitor 300.

The second transistor 200 is a transistor in which a channel is formed in a semiconductor layer including an oxide semiconductor. Since the off-state current of the second transistor 200 is small, by using the second transistor 200 in the semiconductor device (memory device), stored data can be held for a long time. In other words, power consumption can be sufficiently reduced because a semiconductor device (memory device) in which the refresh operation is unnecessary or the frequency of refresh operations is extremely low can be provided.

In FIG. 7B, a wiring 3001 is electrically connected to a source electrode of the first transistor 100. A wiring 3002 is electrically connected to a drain electrode of the first transistor 100. A wiring 3003 is electrically connected to one of a source electrode and a drain electrode of the second transistor 200. A wiring 3004 is electrically connected to a gate electrode of the second transistor 200. A gate electrode of the first transistor 100 and the other of the source electrode and the drain electrode of the second transistor 200 are electrically connected to one electrode of the capacitor 300. A wiring 3005 is electrically connected to the other electrode of the capacitor 300.

When semiconductor devices each having the structure illustrated in FIG. 7A are arranged in a matrix, a memory device (memory cell array) can be manufactured.

The semiconductor device of one embodiment of the present invention includes the capacitor 300 in which the first electrode includes a protruding portion, which leads to a smaller area and higher integration of the semiconductor device. In the capacitor 300, at least the distance between the electrodes in a region where the top surface of the protruding portion of the first electrode overlaps with an edge of the second electrode is longer than that at the side surface of the protruding portion of the first electrode; with such a structure, short-circuit between the electrodes can be prevented.

The semiconductor device illustrated in FIG. 7A includes the first transistor 100, the second transistor 200, and the capacitor 300. The second transistor 200 is provided over the first transistor 100. The capacitor 300 is provided between the first transistor 100 and the second transistor 200.

The first transistor 100 is provided on a semiconductor substrate 101 and includes a semiconductor film 102 that is part of the semiconductor substrate 101, a gate insulating film 104, a gate electrode 105, and low-resistance layers 103a and 103b serving as source and drain regions.

The first transistor 100 may be either a p-channel transistor or an n-channel transistor, and an appropriate transistor may be used depending on the circuit configuration or the driving method.

It is preferable that a region of the semiconductor film 102 where a channel is formed, a region in the vicinity thereof, the low-resistance layers 103a and 103b serving as source and drain regions, and the like include a semiconductor, such as a silicon-based semiconductor, more preferably, single crystal silicon. Alternatively, a material including germanium (Ge), silicon germanium (SiGe), gallium arsenide (GaAs), gallium aluminum arsenide (GaAlAs), or the like may be used. Silicon whose effective mass is controlled by applying stress to the crystal lattice and thereby changing the lattice spacing may also be used. Alternatively, the first transistor 100 may be formed as a high-electron-mobility transistor (HEMT) with the use of, for example, GaAs and GaAlAs.

The low-resistance layers 103a and 103b contain an element that imparts n-type conductivity, such as arsenic or phosphorus, or an element that imparts p-type conductivity, such as boron, in addition to a semiconductor material used for the semiconductor film 102.

The gate electrode 105 can be formed using a semiconductor material, such as silicon, containing the element that imparts n-type conductivity, such as arsenic or phosphorus, or the element that imparts p-type conductivity, such as boron, or a conductive material, such as a metal material, an alloy material, or a metal oxide material. To adjust the threshold voltage of the transistor, the work function is preferably adjusted by utilizing the gate electrode. Specifically, it is preferable to use titanium nitride, tantalum nitride, or the like for the gate electrode. Furthermore, to ensure conductivity and embeddability of the gate electrode, it is preferable that the gate electrode be a stack of metal materials, such as tungsten and aluminum. In particular, tungsten is preferable in terms of heat resistance.

Figure 8:
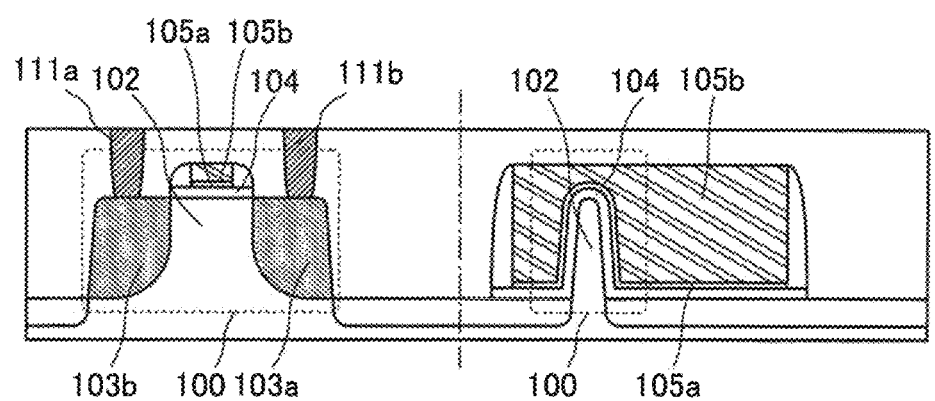
FIG. 8 illustrates a structural example of a transistor of one embodiment.

The first transistor 100 may be a transistor as illustrated in FIG. 8. FIG. 8 illustrates a cross section of the first transistor 100 in the channel length direction on the left side of the dashed-dotted line and a cross section of the first transistor 100 in the channel width direction on the right side of the dashed-dotted line. In the first transistor 100 illustrated in FIG. 8, the semiconductor film 102 (part of the semiconductor substrate 101) in which a channel is formed includes a protruding portion. In addition, gate electrodes 105a and 105b are provided so as to cover the side surface and the top surface of the semiconductor film 102 with the gate insulating film 104 provided therebetween. Note that the gate electrode 105a may be formed using a material with which the work function can be adjusted. The first transistor 100 which utilizes the protruding portion of the semiconductor substrate is also referred to as a fin-type transistor. An insulating film serving as a mask for forming the protruding portion may be provided in contact with the top surface of the protruding portion. Although the case where the protruding portion is formed by processing part of the semiconductor substrate is described here, a semiconductor film including a protruding portion may be formed by processing an SOI substrate.

An insulating film 121, an insulating film 122, and an insulating film 301 are stacked in this order so as to cover the first transistor 100.

The insulating film 121 serves as a planarization film for eliminating a level difference generated by the first transistor 100 or the like underlying the insulating film 121. The top surface of the insulating film 121 may be planarized by planarization treatment using a chemical mechanical polishing (CMP) method or the like to increase the level of planarity.

A wiring 110 that is electrically connected to the capacitor 300 or the second transistor 200 and the like are embedded in the insulating film 121, the insulating film 122, and the insulating film 301. Note that in this specification and the like, an electrode and a wiring electrically connected to the electrode may be a single component. In other words, there are cases where part of a wiring serves as an electrode and where part of an electrode serves as a wiring.

Wirings (a wiring 308 and the like) can be formed using a conductive material, such as a metal material, an alloy material, or a metal oxide material. It is preferable to use a high-melting-point material which has both heat resistance and conductivity, such as tungsten or molybdenum, and it is particularly preferable to use tungsten. Also, it is particularly preferable to use a low-resistance conductive material, such as aluminum or copper. The use of the above-described materials can reduce the wiring resistance.

A first electrode 302 of the capacitor 300 is provided over the insulating film 301 and the wiring 308. The first electrode 302 is electrically connected to the wiring 308.

A barrier layer 303 and an insulator 304 are provided over the first electrode 302 of the capacitor 300, and a second electrode 305 of the capacitor 300 is provided over the insulator 304.

It is preferable that the capacitor 300 be embedded in an insulating film 306 and that the top surface of the insulating film 306 be planarized.

An insulating film is formed over the insulating film 306. Although two layers, an insulating film 201 and an insulating film 202, are formed in this embodiment, one layer or a stack of three or more layers may be formed.

The insulating film 202 is preferably formed using an oxide material from which part of oxygen is released by heating.

As the oxide material from which oxygen is released by heating, oxide containing oxygen in excess of the stoichiometric composition is preferably used. Part of oxygen is released by heating from an oxide film containing oxygen in excess of the stoichiometric composition. The oxide film containing oxygen in excess of the stoichiometric composition is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The second transistor 200 is provided over the insulating film 202.

One of electrodes 204a and 204b serves as a source electrode, and the other serves as a drain electrode.

The electrodes 204a and 204b are formed to have a single-layer structure or a stacked-layer structure using any of metals, such as aluminum, titanium, chromium, nickel, copper, yttrium, zirconium, molybdenum, silver, tantalum, and tungsten, or an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, or the like can be used. Note that a transparent conductive material containing indium oxide, tin oxide, or zinc oxide may also be used.

A gate insulating film 205 can be formed to have a single-layer structure or a stacked-layer structure using, for example, an insulating film containing a so-called high-k material, such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the above insulating film. Alternatively, the insulating film may be subjected to nitriding treatment. A layer of silicon oxide, silicon oxynitride, or silicon nitride may also be stacked over the insulating film.

As the gate insulating film 205, like the insulating film 202, an oxide insulating film containing oxygen in excess of the stoichiometric composition is preferably used.

When a specific material is used for the gate insulating film, electrons are trapped in the gate insulating film under specific conditions, and the threshold voltage can be thus increased. For example, a material having a lot of electron trap states, such as hafnium oxide, aluminum oxide, or tantalum oxide, is used as part of the gate insulating film, like a stacked-layer film of silicon oxide and hafnium oxide, and the state where the potential of the gate electrode is higher than that of the source electrode or the drain electrode is kept for ten milliseconds or more, typically one minute or more at a higher temperature (a temperature of higher than the operating temperature or the storage temperature of the semiconductor device, or a temperature of higher than or equal to 125° C. and lower than or equal to 450° C., typically higher than or equal to 150° C. and lower than or equal to 300° C.). Thus, electrons are moved from the semiconductor film to the gate electrode, and some of the electrons are trapped by the electron trap states.

In such a transistor in which a necessary amount of electrons is trapped by the electron trap states, the threshold voltage is shifted in the positive direction. By controlling the voltage of the gate electrode, the amount of trapped electrons can be controlled, and thus, the threshold voltage can be controlled. Treatment for trapping the electrons may be performed in the manufacturing process of the transistor.

For example, the treatment is preferably performed at any step before factory shipment, such as after the formation of a wiring connected to the source electrode or the drain electrode of the transistor, after pretreatment (wafer processing), after a wafer-dicing step, after packaging, or the like. In either case, it is preferable that the semiconductor device be not exposed to temperatures of higher than or equal to 125° C. for one hour or more after the treatment for trapping electrons.

A gate electrode 206 including conductors 206a and 206b can be formed using, for example, a metal selected from aluminum, chromium, copper, tantalum, titanium, molybdenum, and tungsten, an alloy containing any of these metals as its component, an alloy containing any of these metals in combination, or the like. Alternatively, one or more metals selected from manganese and zirconium may be used. Further alternatively, a semiconductor typified by polycrystalline silicon doped with an impurity element, such as phosphorus, or a silicide, such as nickel silicide, may be used. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used. Alternatively, an alloy film containing aluminum and one or more metals selected from titanium, tantalum, tungsten, molybdenum, chromium, neodymium, and scandium, or a nitride film thereof may be used.

The gate electrode 206 can also be formed using a light-transmitting conductive material, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

Figure 9A:
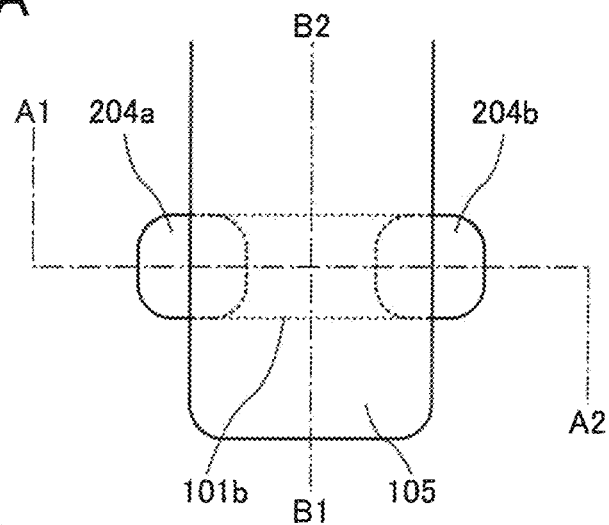
FIG. 9A illustrates a top view structure and FIGS. 9B and 9C illustrate a cross-sectional structure of a transistor of one embodiment.
Figure 9B:
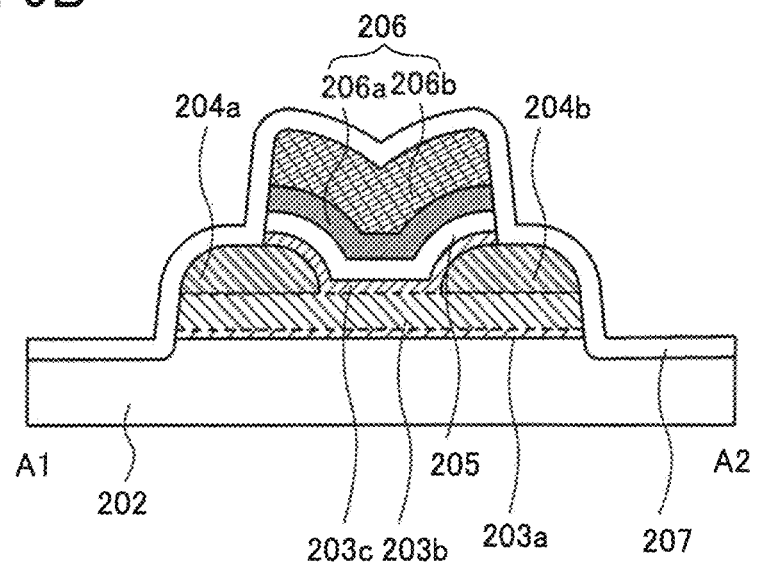
Figure 9C:
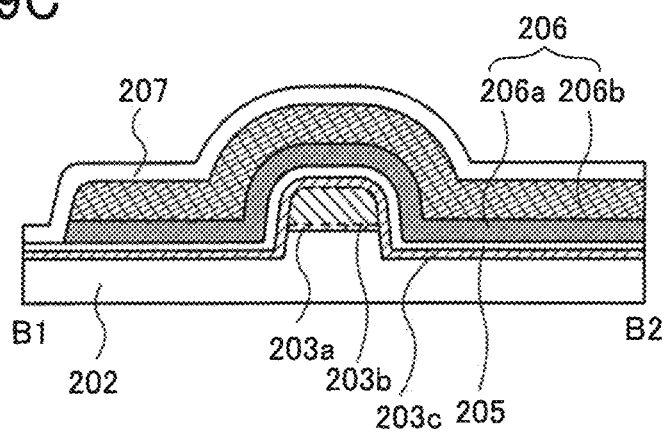

Another structural example of a transistor that can be used as the second transistor 200 is described. FIG. 9A is a schematic top view of a transistor described below as an example, and FIGS. 9B and 9C are schematic cross-sectional views taken along section lines A1-A2 and B1-B2, respectively, in FIG. 9A. Note that FIG. 9B corresponds to a cross section of the transistor in the channel length direction, and FIG. 9C corresponds to a cross section of the transistor in the channel width direction.

As illustrated in FIG. 9C, the gate electrode 206 is provided so as to face the top surface and the side surface of an oxide semiconductor layer 203b in a cross section of the transistor in the channel width direction. Thus, a channel is formed not only in the vicinity of the top surface but also in the vicinity of the side surface of the oxide semiconductor layer 203b, and the effective channel width is increased, which results in increased current in an on state (i.e., on-state current) of the transistor. In particular, in the case where the width of the oxide semiconductor layer 203b is extremely small (for example, less than or equal to 50 nm, preferably less than or equal to 30 nm, more preferably less than or equal to 20 nm), the proportion of a region where a channel is formed is increased inside the oxide semiconductor layer 203b. Thus, as the miniaturization advances, contribution of this structure to on-state current increases.

Figure 10A:
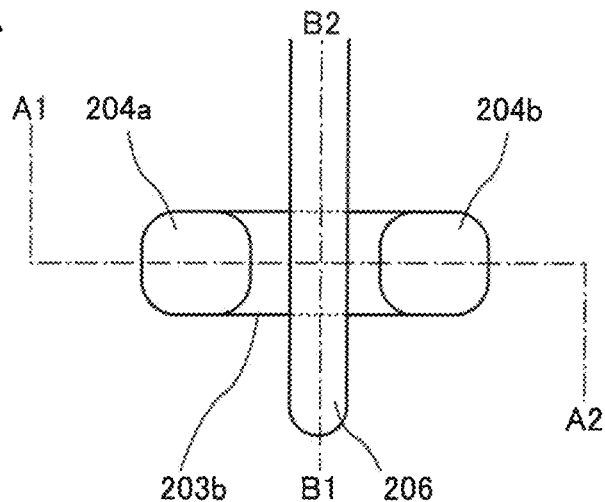
FIG. 10A illustrates a top view structure and FIGS. 10B and 10C illustrate a cross-sectional structure of a transistor of one embodiment.
Figure 10B:
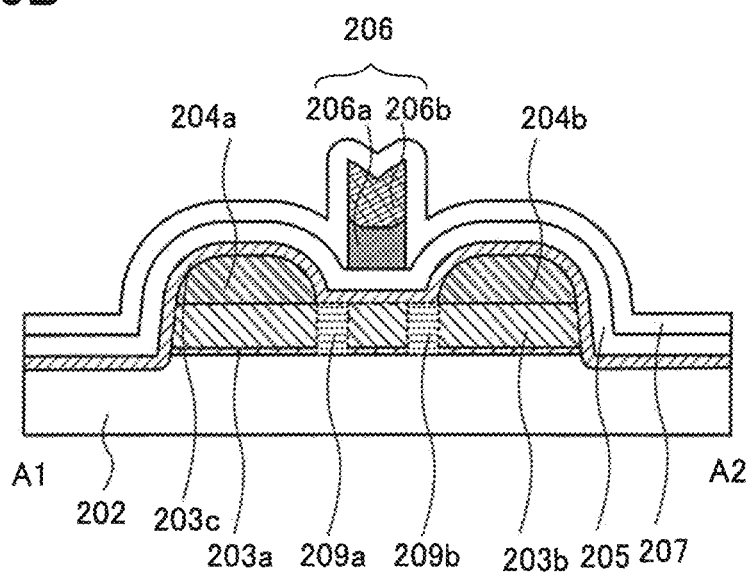
Figure 10C:
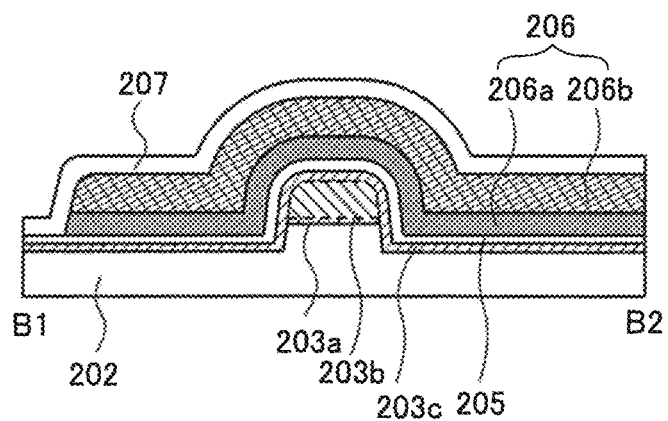

The width of the gate electrode 206 may be made small as illustrated in FIGS. 10A to 10C. In that case, an impurity, such as argon, hydrogen, phosphorus, or boron, can be introduced into the oxide semiconductor layer 203b and the like using the electrodes 204a and 204b, the gate electrode 206, and the like as a mask, for example. As a result, low-resistance regions 209a and 209b can be provided in the oxide semiconductor layer 203b and the like. Note that the low-resistance regions 209a and 209b are not necessarily provided. The width of the gate electrode 206 can be made small not only in the structure illustrated in FIGS. 9A to 9C but also in other structures.

Figure 11A:
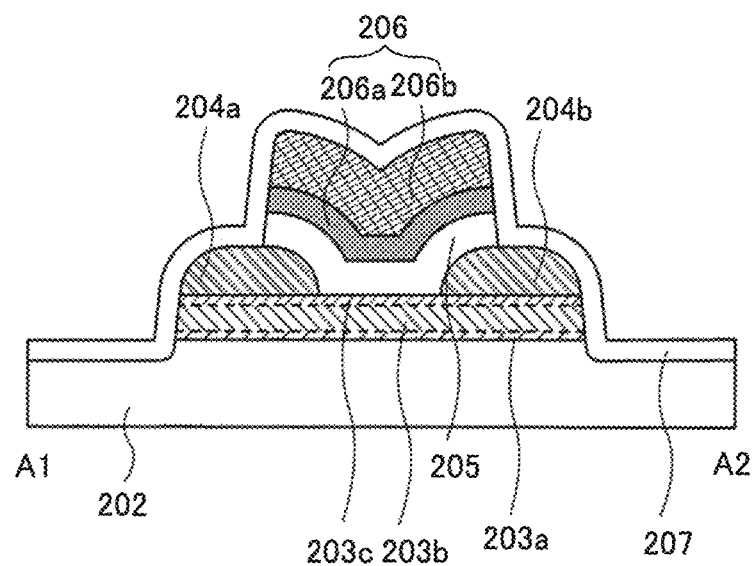
FIGS. 11A and 11B illustrate a structural example of a transistor of one embodiment.
Figure 11B:
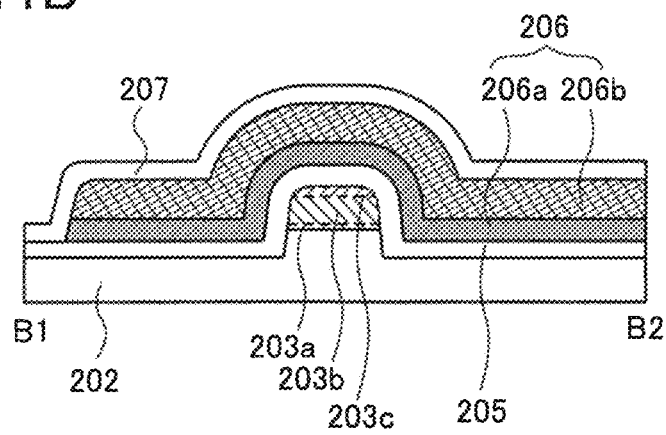

A transistor illustrated in FIGS. 11A and 11B differs from the transistor illustrated in FIGS. 9A to 9C mainly in that an oxide semiconductor layer 203c is provided in contact with bottom surfaces of the electrodes 204a and 204b.

Such a structure enables films used for an oxide semiconductor layer 203a, the oxide semiconductor layer 203b, and the oxide semiconductor layer 203c to be formed successively without contact with the air, which can reduce defects at each interface.

Although the oxide semiconductor layers 203a and 203c are provided in contact with the oxide semiconductor layer 203b in the above-described structure, one of the oxide semiconductor layers 203a and 203c or neither of them may be provided.

Figure 12A:
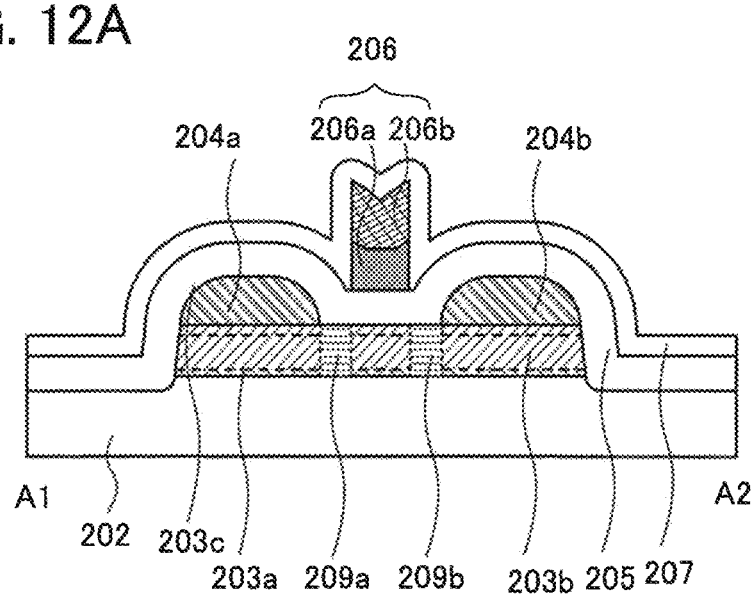
FIGS. 12A and 12B illustrate a structural example of a transistor of one embodiment.
Figure 12B:
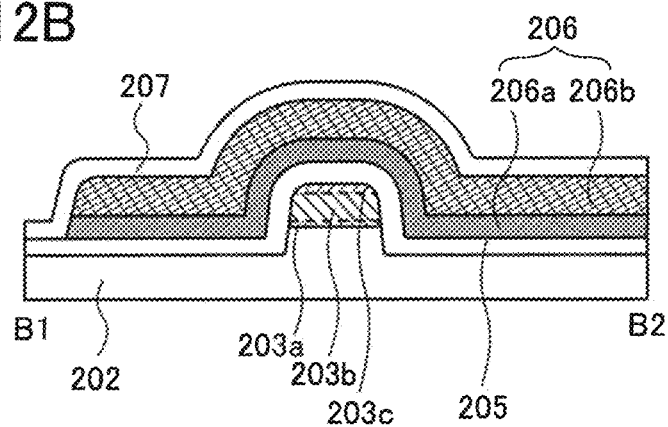

Note that the width of the gate electrode 206 can be made small in the structure illustrated in FIGS. 11A and 11B as in the structure illustrated in FIGS. 9A to 9C. An example in that case is illustrated in FIGS. 12A and 12B. Note that the width of the gate electrode 206 can be made small not only in the structures illustrated in FIGS. 9A to 9C and FIGS. 11A and 11B but also in other structures.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value, in a region where a channel is formed.

Note that depending on the structure of a transistor, the channel width in a region where a channel is formed actually (hereinafter referred to as an effective channel width) is different from the channel width shown in a top view of the transistor (hereinafter referred to as an apparent channel width) in some cases. For example, in a transistor having a three-dimensional structure, the effective channel width is larger than the apparent channel width shown in a top view of the transistor, and its influence cannot be ignored in some cases. For example, in a miniaturized transistor having a three-dimensional structure, the proportion of a channel region formed at the side surface of a semiconductor is high in some cases. In that case, the effective channel width in a region where a channel is actually formed is larger than the apparent channel width shown in the top view.

In a transistor having a three-dimensional structure, the effective channel width is difficult to measure in some cases. For example, estimation of the effective channel width from a design value requires an assumption that the shape of a semiconductor is known. Therefore, in the case where the shape of a semiconductor is not accurately known, it is difficult to measure the effective channel width accurately.

Thus, in this specification, the apparent channel width that is the length of a portion where a source and a drain face each other in a region where a semiconductor and a gate electrode overlap with each other in a top view of a transistor is referred to as a surrounded channel width (SCW) in some cases. Furthermore, in this specification, in the case where the term "channel width" is simply used, it may denote the surrounded channel width or the apparent channel width. Alternatively, in this specification, in the case where the term "channel width" is simply used, it may denote the effective channel width. Note that the values of the channel length, the channel width, the effective channel width, the apparent channel width, the surrounded channel width, and the like can be determined by obtaining and analyzing a cross-sectional TEM image and the like.

Note that in the case where the field-effect mobility, a current value per channel width, and the like of a transistor are obtained by calculation, the surrounded channel width may be used for the calculation. In that case, the values may be different from those calculated using the effective channel width.

The above is the description of the second transistor 200. An insulating film 207 and an insulating film 208 covering the second transistor 200 may serve as a barrier film or a planarization film which covers an uneven surface of an underlying layer.

The above is the description of the structural example.

[Example of Manufacturing Method]

An example of a method for manufacturing the semiconductor device described in the above structural example will be described below with reference to FIGS. 13A to 13C, FIGS. 14A and 14B, and FIG. 15.

First, the semiconductor substrate 101 is prepared. As the semiconductor substrate 101, for example, a single crystal silicon substrate (including a p-type semiconductor substrate or an n-type semiconductor substrate), a compound semiconductor substrate containing silicon carbide or gallium nitride, or the like can be used. An SOI substrate may also be used as the semiconductor substrate 101. The case where single crystal silicon is used for the semiconductor substrate 101 is described below.

Next, an element isolation layer is formed in the semiconductor substrate 101. The element isolation layer may be formed by a local oxidation of silicon (LOCOS) method, a shallow trench isolation (STI) method, or the like.

In the case where a p-channel transistor and an n-channel transistor are formed on the same substrate, an n-well or a p-well may be formed in part of the semiconductor substrate 101. For example, a p-well may be formed by adding an impurity element that imparts p-type conductivity, such as boron, to the n-type semiconductor substrate 101, and an n-channel transistor and a p-channel transistor may be formed on the same substrate.

Next, an insulating film to be the gate insulating film 104 is formed over the semiconductor substrate 101. For example, after surface nitriding treatment, oxidizing treatment may be performed to oxidize the interface between silicon and silicon nitride, whereby a silicon oxynitride film may be formed. For example, a silicon oxynitride film can be obtained by performing oxygen radical oxidation after a thermal silicon nitride film is formed on the surface at 700° C. in an $NH_3$ atmosphere.

The insulating film may also be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

Next, a conductive film to be the gate electrode 105 is formed. It is preferable that the conductive film be formed using a metal selected from tantalum, tungsten, titanium, molybdenum, chromium, niobium, and the like, or an alloy material or a compound material containing any of these metals as its main component. Alternatively, polycrystalline silicon to which an impurity, such as phosphorus, is added can be used. Further alternatively, a stacked-layer structure including a metal nitride film and a film of any of the above metals may be used. As a metal nitride, tungsten nitride, molybdenum nitride, or titanium nitride can be used. When the metal nitride film is provided, adhesiveness of the metal film can be increased; thus, separation can be prevented. A metal film which controls the work function of the gate electrode 105 may be used.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, a resist mask is formed over the conductive film by a lithography process or the like, and an unnecessary portion of the conductive film is removed. After that, the resist mask is removed. In this manner, the gate electrode 105 can be formed.

A method for processing a film is described. In the case of finely processing a film, a variety of fine processing techniques can be used. For example, a method may be used in which a resist mask formed by a lithography process or the like is subjected to slimming treatment. Alternatively, a dummy pattern is formed by a lithography process or the like, the dummy pattern is provided with a sidewall and then removed, and a film is etched using the remaining sidewall as a resist mask. To achieve a high aspect ratio, anisotropic dry etching is preferably used for etching of a film. Alternatively, a hard mask formed of an inorganic film or a metal film may be used.

As light used to form the resist mask, for example, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may also be performed by a liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely fine processing can be performed. Note that in the case of performing exposure by scanning of a beam, such as an electron beam, a photomask is not needed.

Before a resist film that is processed into the resist mask is formed, an organic resin film having a function of improving adhesion between a film and the resist film may be formed. The organic resin film can be formed by, for example, a spin coating method to planarize a surface by covering a step thereunder and thus can reduce variation in thickness of the resist mask over the organic resin film. In the case of fine processing, in particular, a material serving as an anti-reflection film against light for the exposure is preferably used for the organic resin film. Examples of such an organic resin film serving as an anti-reflection film include a bottom anti-reflection coating (BARC) film. The organic resin film may be removed at the same time as the removal of the resist mask or after the removal of the resist mask.

After the gate electrode 105 is formed, a sidewall covering the side surface of the gate electrode 105 may be formed. The sidewall can be formed in such a manner that an insulating film thicker than the gate electrode 105 is formed and subjected to anisotropic etching so that only a portion of the insulating film on the side surface of the gate electrode 105 remains.

The insulating film to be the gate insulating film 104 is etched at the same time as the formation of the sidewall, whereby the gate insulating film 104 is formed under the gate electrode 105 and the sidewall. Alternatively, after the gate electrode 105 is formed, the insulating film may be etched using the gate electrode 105 or a resist mask for forming the gate electrode 105 as an etching mask, thereby forming the gate insulating film 104. Alternatively, the insulating film can be used as the gate insulating film 104 without being processed by etching.

Figure 13A:
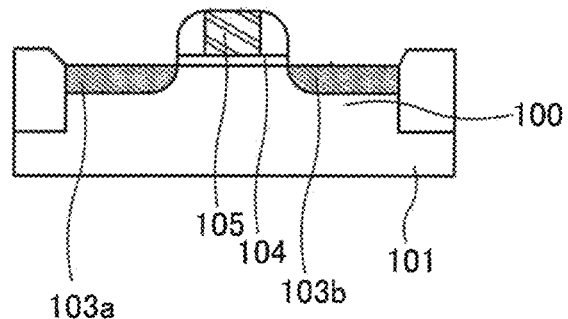
FIGS. 13A to 13C illustrate an example of a method for manufacturing a semiconductor device of one embodiment.

Next, an element that imparts n-type conductivity, such as phosphorus, or an element that imparts p-type conductivity, such as boron, is added to a region of the semiconductor substrate 101 where the gate electrode 105 (and the sidewall) is not provided. FIG. 13A is a schematic cross-sectional view at this stage.

Next, the insulating film 121 is formed, and then, first heat treatment is performed to activate the aforementioned element that imparts conductivity.

The insulating film 121 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 121 is preferably formed using silicon nitride containing oxygen and hydrogen (SiNOH) because the amount of hydrogen released by heating can be increased. Alternatively, the insulating film 121 can also be formed using silicon oxide with high step coverage that is formed by reacting tetraethyl orthosilicate (TEOS), silane, or the like with oxygen, nitrous oxide, or the like.

The insulating film 121 can be formed by, for example, a sputtering method, a CVD method (including a thermal CVD method, an MOCVD method, a PECVD method, and the like), an MBE method, an ALD method, a PLD method, or the like. In particular, it is preferable that the insulating film be formed by a CVD method, more preferably, a plasma CVD method because coverage can be improved. It is preferable to use a thermal CVD method, an MOCVD method, or an ALD method in order to reduce plasma damage.

The first heat treatment can be performed, for example, at a temperature of higher than or equal to 400° C. and lower than the strain point of the substrate in an inert gas atmosphere, such as a rare gas atmosphere or a nitrogen gas atmosphere, or in a reduced-pressure atmosphere.

At this stage, the first transistor 100 is completed.

Next, the top surface of the insulating film 121 is planarized by a CMP method or the like.

Next, openings that reach the low-resistance layers 103*a* and 103*b*, the gate electrode 105, and the like are formed in the insulating film 121. After that, a conductive film is formed so as to fill the openings, and the conductive film is subjected to planarization treatment to expose the top surface of the insulating film 121, whereby a wiring 111*a*, a wiring 111*b*, a wiring 110, and the like are formed. The conductive film can be formed by, for example, a sputtering method, a CVD method (including a thermal CVD method, an MOCVD method, a PECVD method, and the like), an MBE method, an ALD method, a PLD method, or the like.

A conductive film is then formed over the insulating film 121. Then, a resist mask is formed by a method similar to that described above, and an unnecessary portion of the conductive film is removed by etching. After that, the resist mask is removed; thus, wirings are formed. Then, the insulating film 122 is formed and planarized by a CMP method or the like so that the top surfaces of the wirings are exposed. In this manner, embedded wirings are formed. Alternatively, the embedded wirings may be formed by a damascene method. Note that the insulating film 122 can be formed using a material and a method similar to those of the insulating film 121.

Figure 13B:
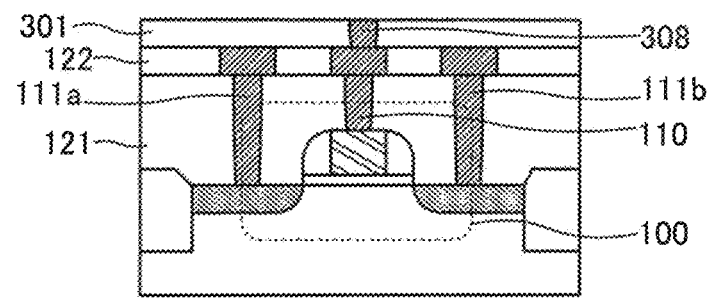

Next, the insulating film 301 is formed, and a contact hole that reaches the wiring connected to the wiring 110 is formed in the insulating film 301. Then, the wiring 308 is formed using a material and a method similar to those of the wiring 110. FIG. 13B is a schematic cross-sectional view at this stage.

Figure 13C:
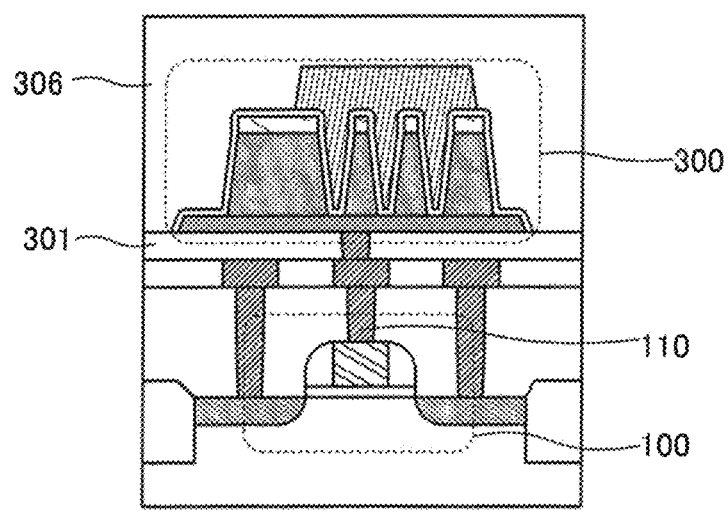

Then, the capacitor 300 is formed so as to be connected to the wiring 308 by the manufacturing method described in Embodiment 1. FIG. 13C is a schematic cross-sectional view at the stage after the formation of the capacitor 300.

Then, an insulating film to be the insulating film 306 that covers the capacitor 300 is formed. The insulating film to be the insulating film 306 can be formed using a material and a method similar to those of the insulating film 121 or the like.

After the insulating film to be the insulating film 306 is formed, the insulating film may be subjected to planarization treatment using a CMP method or the like to improve the level of planarity of the top surface, thereby forming the insulating film 306.

Then, an insulating film to be the insulating film 201 and an insulating film to be the insulating film 202 are formed. The insulating film to be the insulating film 201 and the insulating film to be the insulating film 202 can each be formed by, for example, a sputtering method, a CVD method (including a thermal CVD method, an MOCVD method, a PECVD method, and the like), an MBE method, an ALD method, a PLD method, or the like. In particular, it is preferable that the insulating films be formed by a CVD method, more preferably, a plasma CVD method because coverage can be improved. It is preferable to use a thermal CVD method, an MOCVD method, or an ALD method in order to reduce plasma damage.

To make the insulating film to be the insulating film 202 contain excess oxygen, the insulating film to be the insulating film 202 may be formed in an oxygen atmosphere, for example. Alternatively, a region containing excess oxygen may be formed by introducing oxygen into the insulating film to be the insulating film 202 that has been formed. These two methods may also be combined.

For example, oxygen (including at least one of an oxygen radical, an oxygen atom, and an oxygen ion) is introduced into the insulating film to be the insulating film 202 that has been formed, so that a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, dinitrogen monoxide, nitrogen dioxide, carbon dioxide, carbon monoxide, or the like can be used. Furthermore, a rare gas may be contained in the gas containing oxygen for the oxygen introducing treatment. For example, a mixed gas of carbon dioxide, hydrogen, and argon can be used.

After the insulating film to be the insulating film 202 is formed, the insulating film may be subjected to planarization treatment using a CMP method or the like to improve the level of planarity of the top surface, thereby forming the insulating film 202.

Next, an oxide semiconductor film to be the oxide semiconductor layer 203a and an oxide semiconductor film to be the oxide semiconductor layer 203b are formed in this order. The oxide semiconductor films are preferably formed successively without contact with the air.

After the oxide semiconductor film to be the oxide semiconductor layer 203b is formed, heat treatment is preferably performed. The heat treatment may be performed at a temperature of higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. The heat treatment may be performed directly after the formation of the oxide semiconductor film to be the oxide semiconductor layer 203b or may be performed after the oxide semiconductor film to be the oxide semiconductor layer 203b is processed into the island-shaped oxide semiconductor layer 203b. Through the heat treatment, oxygen can be supplied to the oxide semiconductor layer from the insulating film 202; thus, oxygen vacancies in the oxide semiconductor layer can be reduced.

Next, over the oxide semiconductor film to be the oxide semiconductor layer 203b, a conductive film to be a hard mask is formed, and a resist mask is formed by a method similar to that described above; then, an unnecessary portion of the conductive film is removed by etching. After that, unnecessary portions of the oxide semiconductor films are removed by etching using the conductive film as a mask. Then, the resist mask is removed. In this manner, a stacked-layer structure including the island-shaped oxide semiconductor layers 203a and 203b can be formed. Note that the conductive film serving as a hard mask may be used as part of the electrodes 204a and 204b that are formed later.

Figure 14A:
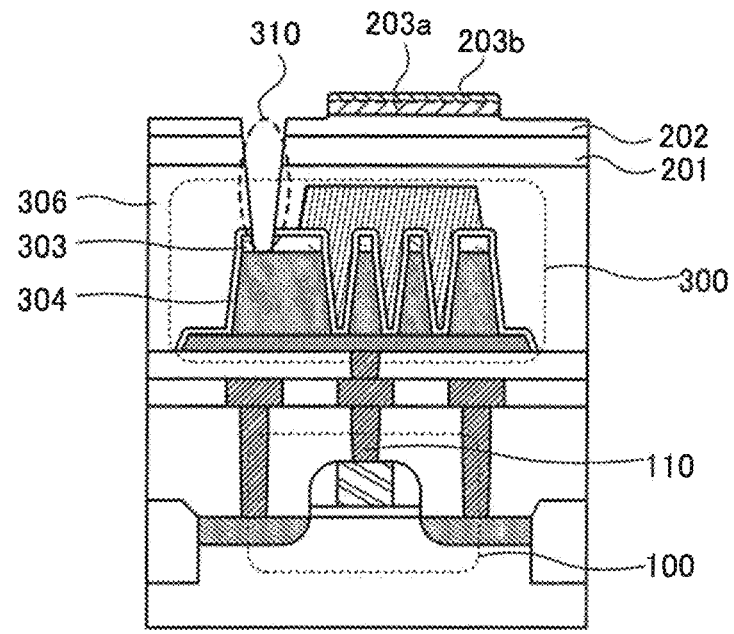
FIGS. 14A and 14B illustrate an example of a method for manufacturing a semiconductor device of one embodiment.
Figure 14B:
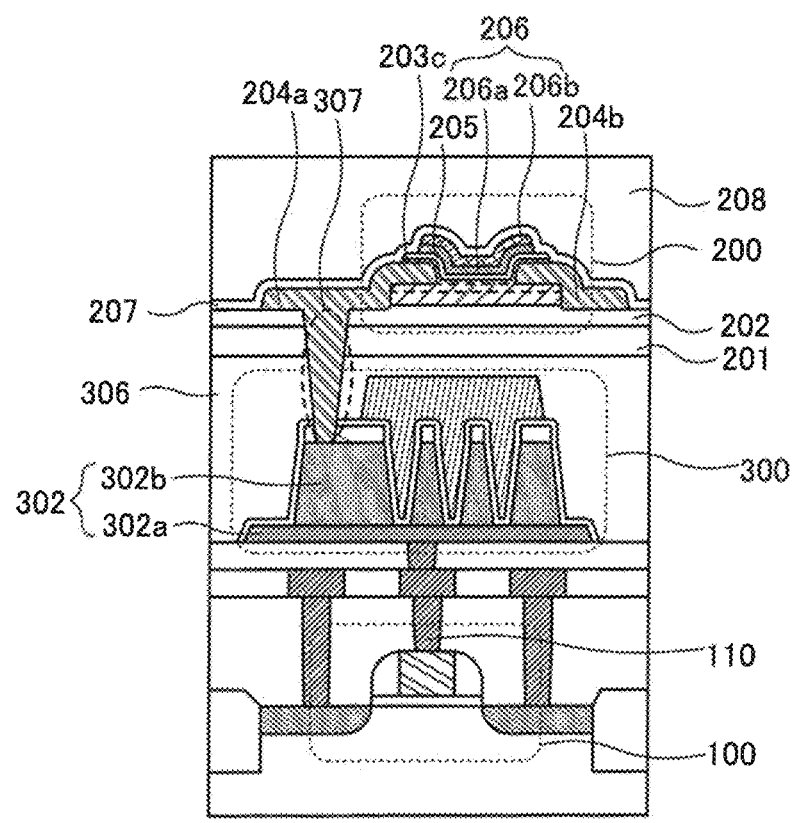

Then, a resist mask is formed over the insulating film 202 and the island-shaped oxide semiconductor layers 203a and 203b, and a contact hole 310 that penetrates the insulating film 202, the insulating film 201, the insulating film 306, the insulator 304, and the barrier layer 303 is formed (see FIG. 14A).

Then, a conductive film is formed. The conductive film can be formed by, for example, a sputtering method, a CVD method (including a thermal CVD method, an MOCVD method, a PECVD method, and the like), an MBE method, an ALD method, a PLD method, or the like. In particular, it is preferable that the conductive film be formed by a CVD method, more preferably, a plasma CVD method because coverage can be improved. It is preferable to use a thermal CVD method, an MOCVD method, or an ALD method in order to reduce plasma damage.

Next, a resist mask is formed over the conductive film by a method similar to that described above, and an unnecessary portion of the conductive film is removed by etching. After that, the resist mask is removed. In this manner, the electrodes 204a and 204b and a wiring 307 that connects the electrode 204a to the first electrode 302 of the capacitor 300 through the contact hole 310 can be formed at the same time.

Then, an oxide semiconductor film to be the oxide semiconductor layer 203c and an insulating film are formed in this order. A resist mask is formed over the insulating film by a method similar to that described above, and unnecessary portions of the insulating film and the oxide semiconductor film are removed by etching. Then, the resist mask is removed, so that the oxide semiconductor layer 203c and the gate insulating film 205 are formed.

Next, conductive films are formed, and the gate electrode 206 including the conductors 206a and 206b is formed.

At this stage, the second transistor 200 is completed.

Then, the insulating film 207 is formed, and the insulating film 208 is formed as necessary. The insulating film 207 and the insulating film 208 can each be formed by, for example, a sputtering method, a CVD method (including a thermal CVD method, an MOCVD method, a PECVD method, and the like), an MBE method, an ALD method, or a PLD method.

In particular, it is preferable that the insulating films be formed by a CVD method, more preferably, a plasma CVD method because coverage can be improved. It is preferable to use a thermal CVD method, an MOCVD method, or an ALD method in order to reduce plasma damage (see FIG. 14B).

Through the above steps, the semiconductor device of one embodiment of the present invention can be manufactured.

Modification Example 1

Figure 15:
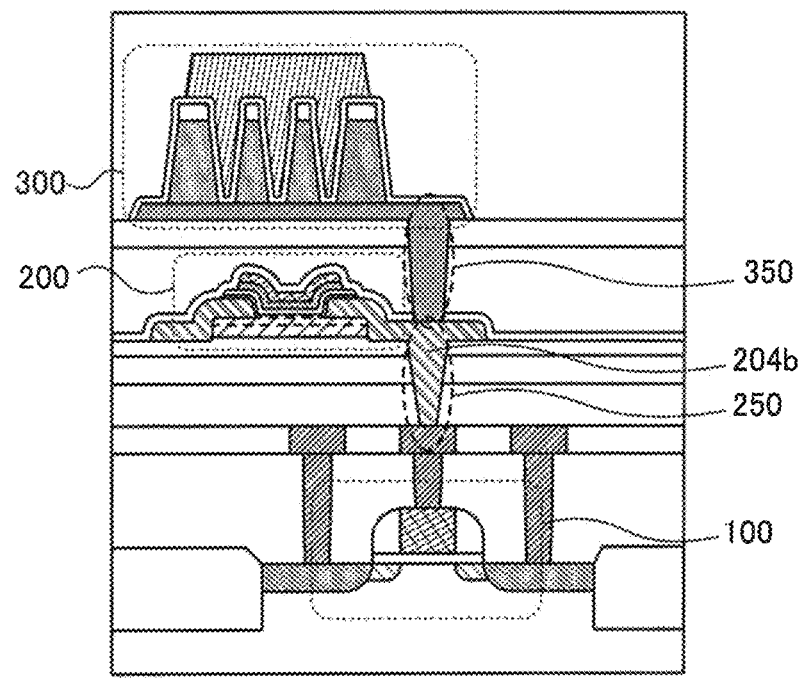
FIG. 15 illustrates a structural example of a semiconductor device of one embodiment.

FIG. 15 illustrates a modification example of this embodiment, in which the capacitor 300 is provided over the second transistor 200. Specifically, after the second transistor 200 is formed over the first transistor 100, the capacitor 300 is formed. The first transistor 100 is connected to the second transistor 200 through a wiring 250. In addition, a contact hole is formed in an interlayer insulating film so as to reach a wiring that is formed in the same layer as the electrode 204b of the second transistor 200. A wiring 350 is formed in the contact hole, so that the capacitor 300, the first transistor 100, and the second transistor 200 can be electrically connected to each other.

Modification Example 2

Figure 16A:
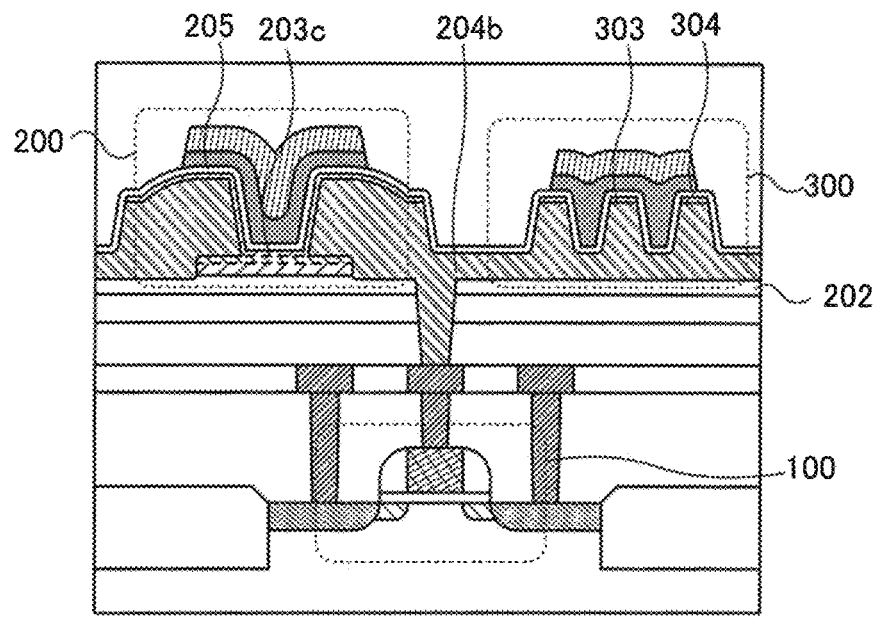
FIGS. 16A and 16B each illustrate a structural example of a semiconductor device of one embodiment.
Figure 16B:
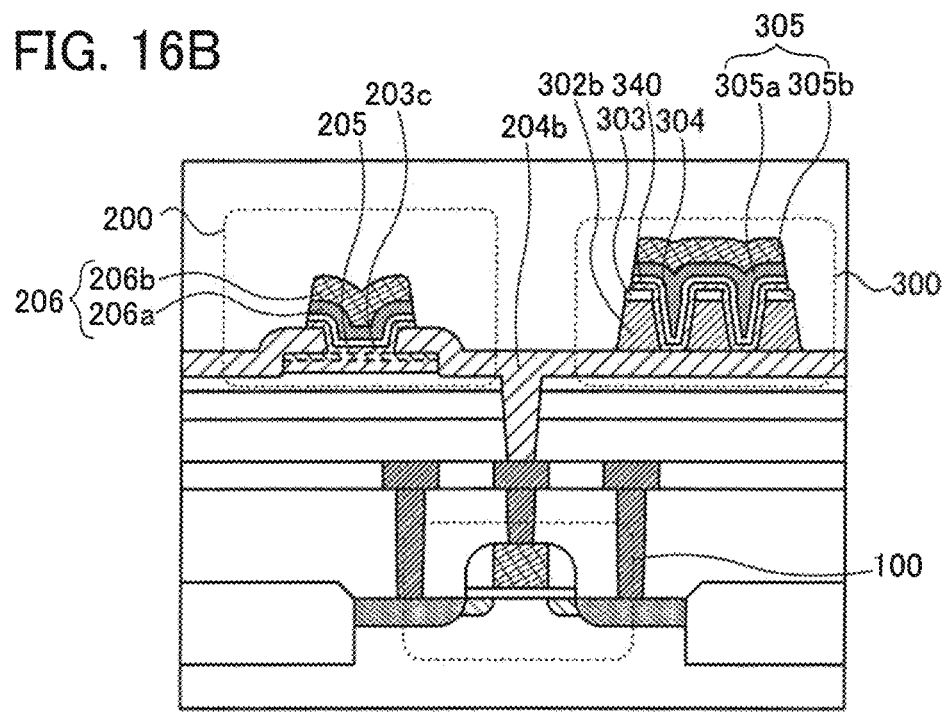

Furthermore, as illustrated in FIGS. 16A and 16B, one of the source electrode and the drain electrode of the second transistor 200 and the first electrode of the capacitor 300 may be formed using the same conductive layer. Therefore, the electrode 204b in the drawings serves as one of the source electrode and the drain electrode of the second transistor 200 and the first electrode of the capacitor 300.

Specific description of FIG. 16A is given below. A conductive film to be the electrode 204b is formed to be sufficiently thick. A resist mask is formed by a method similar to that described above, and an unnecessary portion of the conductive film is removed. Next, the resist mask is removed, and an oxide semiconductor film to be the oxide semiconductor layer 203c and the barrier layer 303 is formed. A resist mask is formed by a method similar to that described above, and an unnecessary portion of the oxide semiconductor film is removed. The resist mask is removed, so that the oxide semiconductor layer 203c and the barrier layer 303 are formed.

Then, the oxide semiconductor layer 203c and the barrier layer 303 are used as a mask, and the conductive film to be the electrode 204b is subjected to half etching in such a manner that the insulating film 202 is not exposed, whereby the electrode 204b serving as one of the source electrode and the drain electrode of the second transistor 200 and the first electrode of the capacitor 300 can be formed.

Then, the insulator 304 (the gate insulating film 205) is formed. Conductive films are formed over the insulator 304. Then, a resist mask is formed in a manner similar to that described above, and unnecessary portions of the conductive films are removed, whereby the second transistor 200 and the capacitor 300 can be formed at the same time.

Specific description of FIG. 16B is given below. The electrode 204b serving as one of the source electrode and the drain electrode of the second transistor 200 and part of the first electrode of the capacitor 300 is formed. After the conductive layer 302b that is a protruding portion of the first electrode and the barrier layer 303 of the capacitor 300 are formed, an oxide semiconductor film to be the oxide semiconductor layer 203c and an intermediate layer 340, an insulating film to be the insulator 304 and the gate insulating film 205, and conductive films to be the second electrode 305 including conductors 305a and 305b and the gate electrode 206 including the conductors 206a and 206b are formed. A resist mask is formed in a manner similar to that described above, and unnecessary portions of the oxide semiconductor film, the insulating film, and the conductive films are removed, whereby the second transistor 200 and the capacitor 300 can be formed at the same time.

With the structure illustrated in FIG. 16A or 16B, the semiconductor device can be suitable for miniaturization and can have higher density with a reduction or without an increase in the number of steps and masks.

At least part of this embodiment can be implemented in combination with any of the other embodiments described in this specification as appropriate.

Embodiment 3

In this embodiment, an oxide semiconductor that can be favorably used for a semiconductor film of the semiconductor device of one embodiment of the present invention will be described.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time contains a void and has an unstable structure. For this reason, an a-like OS has physical properties similar to those of an amorphous oxide semiconductor.

<CAAC-OS>

First, a CAAC-OS is described.

The CAAC-OS is one of oxide semiconductors having a plurality of c-axis aligned crystal parts.

In a combined analysis image (also referred to as a high-resolution transmission electron microscope (TEM)

image) of a bright-field image and a diffraction pattern of the CAAC-OS, which is obtained using a TEM, a plurality of crystal parts can be observed. However, in the high-resolution TEM image, a boundary between crystal parts, that is, a grain boundary is not clearly observed. Thus, in the CAAC-OS, a reduction in electron mobility due to the grain boundary is less likely to occur.

Figure 17A:
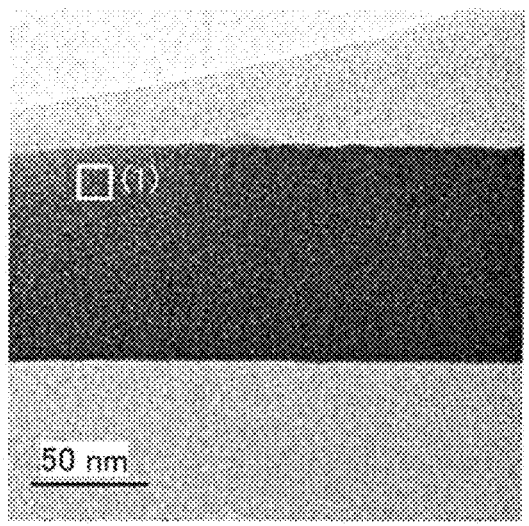
FIGS. 17A to 17C are Cs-corrected high-resolution TEM images of a cross section of a CAAC-OS and FIG. 17D is a cross-sectional schematic view of a CAAC-OS.

A CAAC-OS observed with a TEM is described below. FIG. 17A is a high-resolution TEM image of a cross section of the CAAC-OS which is observed in a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 17C:
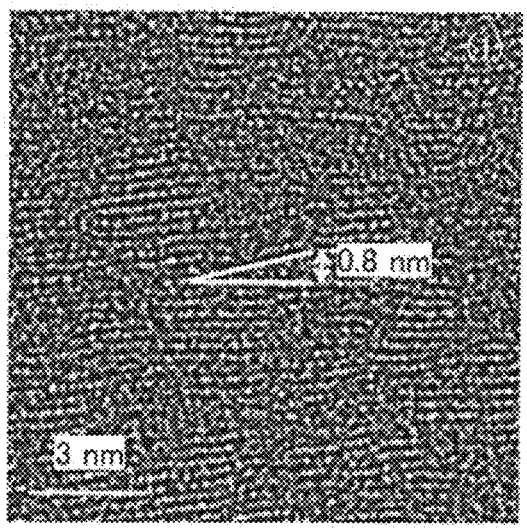
Figure 17B:
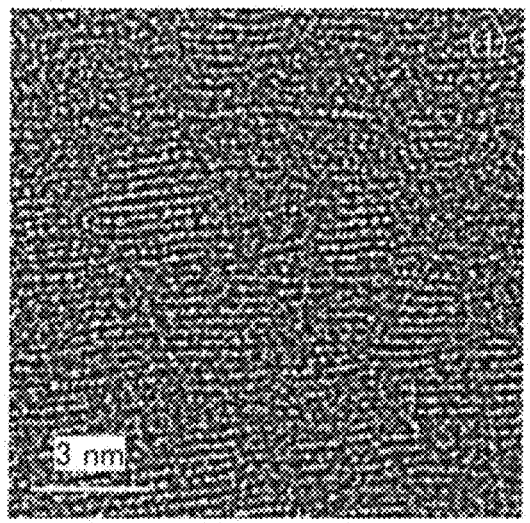

FIG. 17B is an enlarged Cs-corrected high-resolution TEM image of a region (1) in FIG. 17A. FIG. 17B shows that metal atoms are arranged in a layered manner in a crystal part. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

As shown in FIG. 17B, the CAAC-OS has a characteristic atomic arrangement. The characteristic atomic arrangement is denoted by an auxiliary line in FIG. 17C. FIGS. 17B and 17C prove that the size of a crystal part is approximately 1 nm to 3 nm, and the size of a space caused by tilt of the crystal parts is approximately 0.8 nm. Therefore, the crystal part can also be referred to as a nanocrystal (nc). Furthermore, the CAAC-OS can also be referred to as an oxide semiconductor including c-axis aligned nanocrystals (CANC).

Figure 17D:
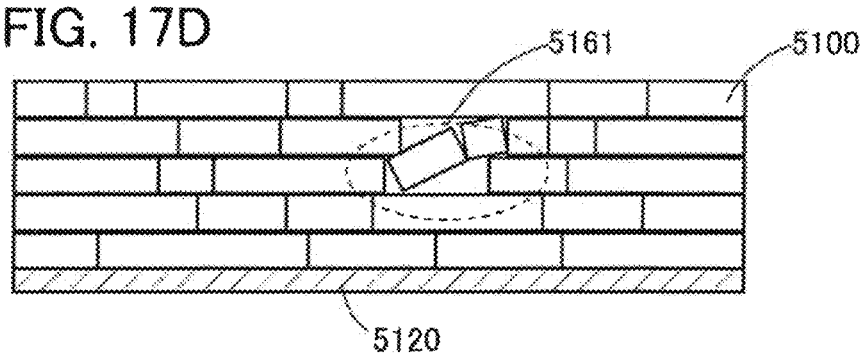

Here, according to the Cs-corrected high-resolution TEM images, the schematic arrangement of crystal parts 5100 of a CAAC-OS over a substrate 5120 is illustrated by such a structure in which bricks or blocks are stacked (see FIG. 17D). The part in which the crystal parts are tilted as observed in FIG. 17C corresponds to a region 5161 shown in FIG. 17D.

Figure 18A:
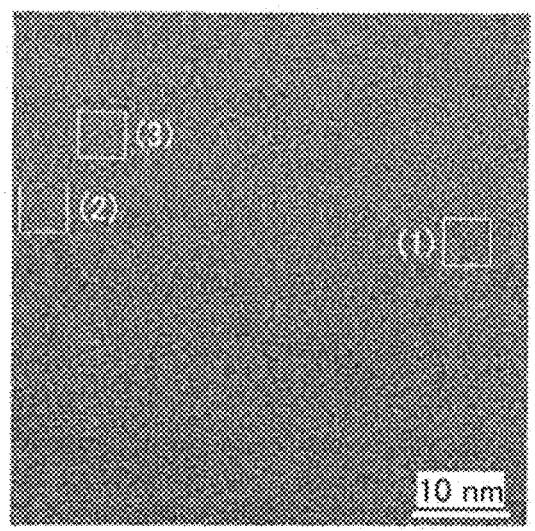
FIGS. 18A to 18D are Cs-corrected high-resolution TEM images of a plane of a CAAC-OS.
Figure 18B:
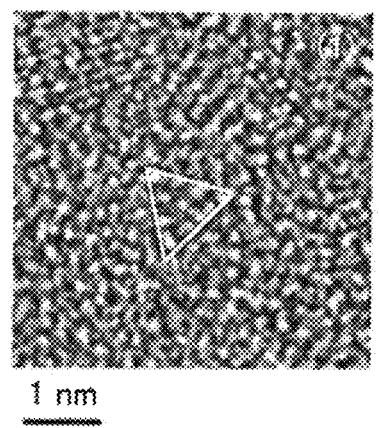
Figure 18C:
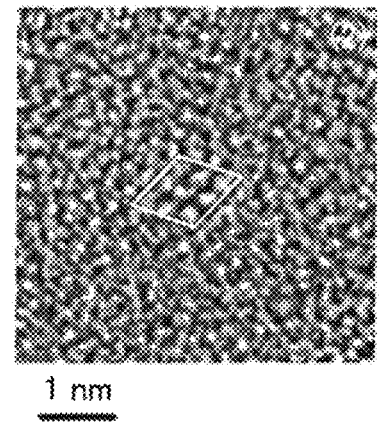
Figure 18D:
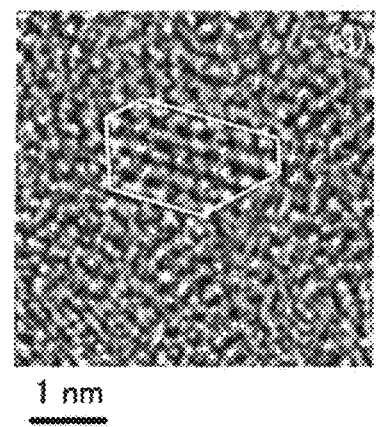

FIG. 18A shows a Cs-corrected high-resolution TEM image of a plane of the CAAC-OS observed in a direction substantially perpendicular to the sample surface. FIGS. 18B, 18C, and 18D are enlarged Cs-corrected high-resolution TEM images of regions (1), (2), and (3) in FIG. 18A, respectively. FIGS. 18B, 18C, and 18D indicate that metal atoms are arranged in a triangular, quadrangular, or hexagonal configuration in a crystal part. However, there is no regularity of arrangement of metal atoms between different crystal parts.

Figure 19A:
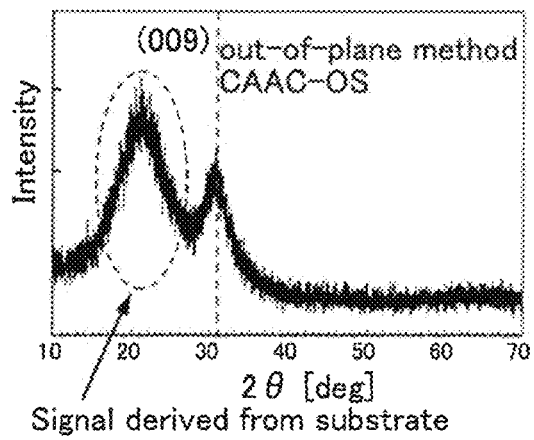
FIGS. 19A to 19C show structural analyses of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 19A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 19B:
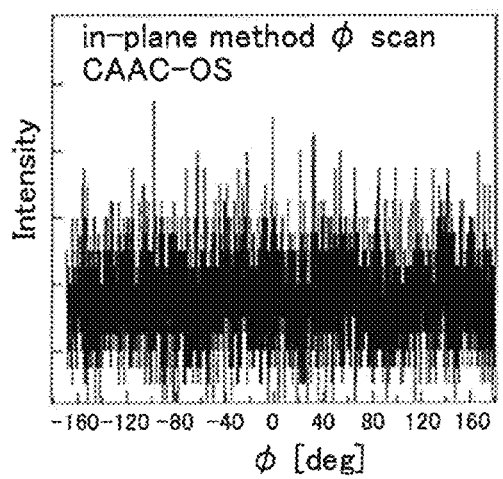
Figure 19C:
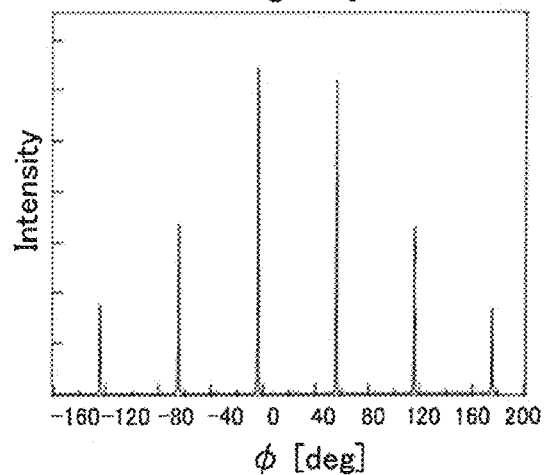

On the other hand, in structural analysis of the CAAC-OS by an in-plane method in which an X-ray is incident on a sample in a direction substantially perpendicular to the c-axis, a peak appears when $2\theta$ is around 56°. This peak is derived from the (110) plane of the $InGaZnO_4$ crystal. In the case of the CAAC-OS, when analysis ($\phi$scan) is performed with $2\theta$ fixed at around 56° and with the sample rotated using a normal vector of the sample surface as an axis ($\phi$ axis), as shown in FIG. 19B, a peak is not clearly observed. In contrast, in the case of a single crystal oxide semiconductor of $InGaZnO_4$, when $\phi$ scan is performed with $2\theta$ fixed at around 56°, as shown in FIG. 19C, six peaks which are derived from crystal planes equivalent to the (110) plane are observed. Accordingly, the structural analysis using XRD shows that the directions of a-axes and b-axes are irregularly oriented in the CAAC-OS.

Figure 20A:
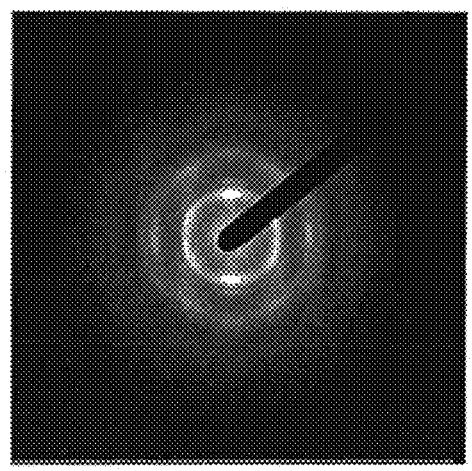
FIGS. 20A and 20B show electron diffraction patterns of a CAAC-OS.
Figure 20B:
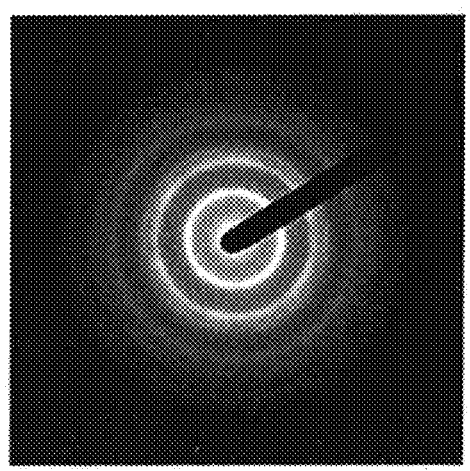

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 20A can be obtained. In this diffraction pattern, spots derived from the (009) plane of an $InGaZnO_4$ crystal are included. Thus, the electron diffraction also indicates that crystal parts included in the CAAC-OS have c-axis alignment and that the c-axes are aligned in a direction substantially perpendicular to the formation surface or the top surface of the CAAC-OS. Meanwhile, FIG. 20B shows a diffraction pattern obtained in such a manner that an electron beam with a probe diameter of 300 nm is incident on the same sample in a direction perpendicular to the sample surface. As shown in FIG. 20B, a ring-like diffraction pattern is observed. Thus, the electron diffraction also indicates that the a-axes and b-axes of the crystal parts included in the CAAC-OS do not have regular alignment. The first ring in FIG. 20B is considered to be derived from the (010) plane, the (100) plane, and the like of the $InGaZnO_4$ crystal. The second ring in FIG. 20B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal, such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor might serve as carrier traps or carrier generation sources when hydrogen is trapped therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, more preferably lower than $1\times10^{10}/cm^3$, and higher than or equal to $1\times10^{-9}/cm^3$). Such an oxide semiconductor is referred to as a highly purified intrinsic or substantially highly purified intrinsic oxide semiconductor. The CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region where a crystal part is observed and a region where a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a crystal part in a CAAC-OS.

In the nc-OS, a microscopic region (for example, a region with a size of greater than or equal to 1 nm and less than or equal to 10 nm, in particular, a region with a size of greater than or equal to 1 nm and less than or equal to 3 nm) has a periodic atomic arrangement. There is no regularity of crystal orientation between different crystal parts in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the diameter of a crystal part, a peak that shows a crystal plane does not appear. Furthermore, a halo pattern is shown in an electron diffraction pattern of the nc-OS obtained by using an electron beam having a probe diameter larger than the diameter of a crystal part (e.g., larger than or equal to 50 nm). Meanwhile, spots are shown in a nanobeam electron diffraction pattern of the nc-OS obtained by using an electron beam having a probe diameter close to, or smaller than the diameter of a crystal part. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

Since there is no regularity of crystal orientation between the crystal parts (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. However, there is no regularity of crystal orientation between different crystal parts in the nc-OS. Therefore, the nc-OS has a higher density of defect states than the CAAC-OS.

<A-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that the a-like OS has an unstable structure as compared with a CAAC-OS and an nc-OS, change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The spacing between these adjacent layers is equivalent to the lattice spacing on the (009) plane (also referred to as d value). The value is calculated to 0.29 nm from crystal structure analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 21:
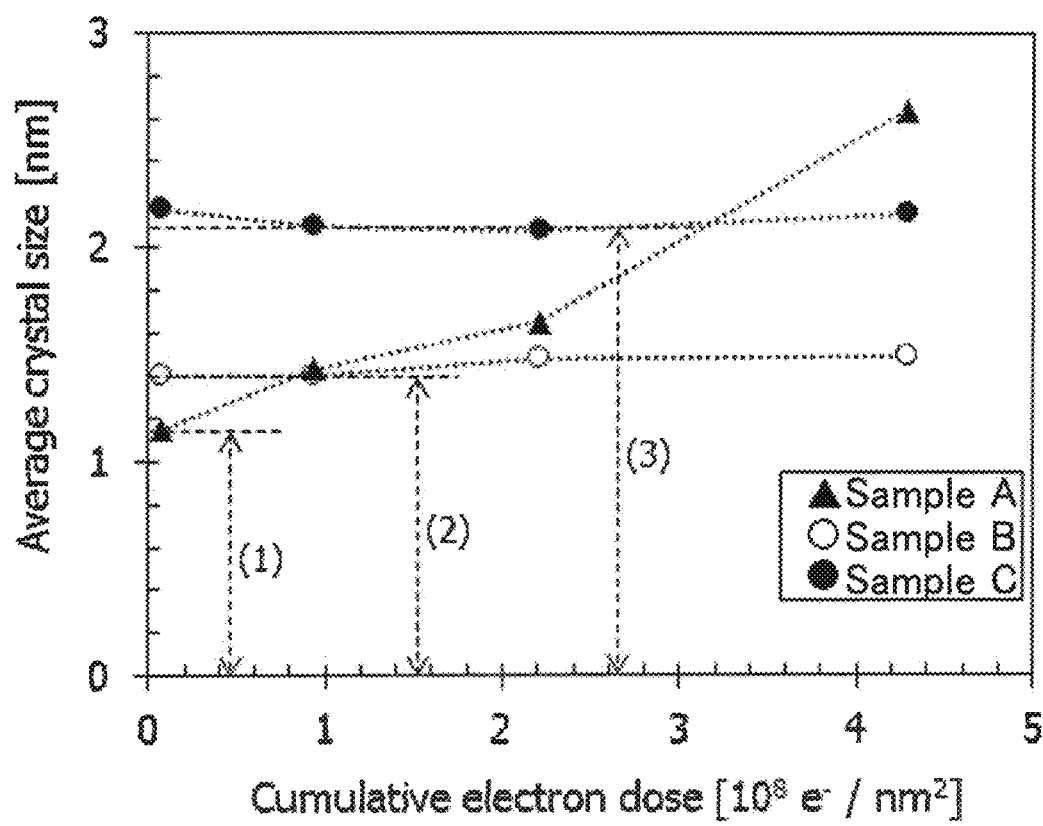
FIG. 21 shows change in a crystal part of an In—Ga—Zn oxide caused by electron irradiation.

FIG. 21 shows change in the average size of crystal parts (at 22 points to 45 points) in each sample. Note that the crystal part size corresponds to the length of a lattice fringe. FIG. 21 indicates that the crystal part size in the a-like OS increases with an increase in the cumulative electron dose. Specifically, as shown by (1) in FIG. 21, a crystal part of approximately 1.2 nm (also referred to as an initial nucleus) at the start of TEM observation grows to a size of approximately 2.6 nm at a cumulative electron dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. Specifically, as shown by (2) and (3) in FIG. 21, the average crystal sizes in the nc-OS and the CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that a single crystal oxide semiconductor with the same composition does not exist in some cases. In that case, single crystal oxide semiconductors with different compositions are combined at an adequate ratio, which makes it possible to calculate density equivalent to that of a single crystal oxide semiconductor with a desired composition. The density of a single crystal oxide semiconductor with a desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Embodiment 4

In this embodiment, a structural example of a semiconductor device including the transistor of one embodiment of the present invention will be described with reference to the drawings.

[Cross-Sectional Structure]

Figure 22A:
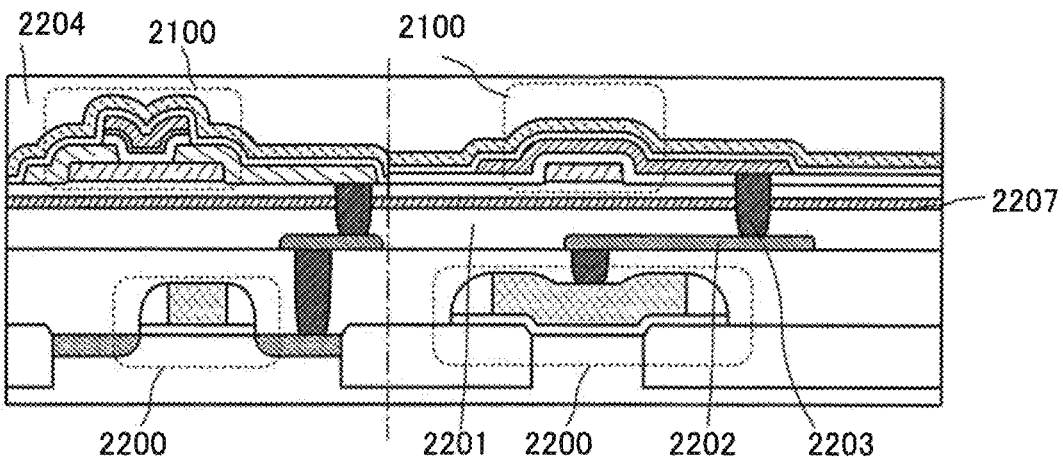
FIGS. 22A and 22D are cross-sectional views and FIGS. 22B and 22C are circuit diagrams of one embodiment of a semiconductor device.

FIG. 22A is a cross-sectional view of a semiconductor device of one embodiment of the present invention. The semiconductor device illustrated in FIG. 22A includes a transistor 2200 including a first semiconductor material in a lower portion and a transistor 2100 including a second semiconductor material in an upper portion. A cross-sectional view of the transistors in the channel length direction is on the left side of the dashed-dotted line, and a cross-sectional view of the transistors in the channel width direction is on the right side of the dashed-dotted line.

Note that the transistor 2100 may be provided with a back gate.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor including a material other than an oxide semiconductor, such as single crystal silicon, can operate at high speed easily. On the other hand, a transistor including an oxide semiconductor has a small off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which includes an oxide semiconductor.

FIG. 22A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. In addition, an interlayer insulating film 2204 covering the transistor 2100 is provided.

The stack of the two kinds of transistors reduces the area occupied by the circuit, allowing a plurality of circuits to be highly integrated.

In the case where a silicon-based semiconductor material is used for the transistor 2200 provided in the lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in the upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 including an oxide semiconductor is provided over the transistor 2200 including a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 can also be improved.

The insulating film 2207 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing entry of hydrogen may be formed over the transistor 2100 so as to cover the transistor 2100 including an oxide semiconductor film. For the blocking film, a material that is similar to that of the insulating film 2207 can be used, and in particular, aluminum oxide is preferably used. The aluminum oxide film has a high shielding (blocking) effect of preventing penetration of both oxygen and impurities, such as hydrogen and moisture. Thus, by using the aluminum oxide film as the blocking film covering the transistor 2100, release of oxygen from the oxide semiconductor film included in the transistor 2100 and entry of water and hydrogen into the oxide semiconductor film can be prevented.

Note that the transistor 2200 can be a transistor of various types without being limited to a planar type transistor. For example, the transistor 2200 can be a fin-type transistor, a tri-gate transistor, or the like. An example of a cross-sectional view in that case is illustrated in FIG. 22D. An insulating film 2212 is provided over a semiconductor substrate 2211. The semiconductor substrate 2211 includes a protruding portion with a thin tip (also referred to a fin).

Note that an insulating film may be provided over the protruding portion. The insulating film serves as a mask for preventing the semiconductor substrate 2211 from being etched when the protruding portion is formed. Alternatively, the protruding portion does not necessarily have a thin tip; a cuboid-like protruding portion or a protruding portion with a thick tip can be used, for example. A gate insulating film 2214 is provided over the protruding portion of the semiconductor substrate 2211, and a gate electrode 2213 is provided over the gate insulating film 2214. Although the gate electrode 2213 has a single-layer structure in this embodiment, one embodiment of the present invention is not limited to this example, and the gate electrode 2213 may have a stacked-layer structure of two or more layers. Source and drain regions 2215 are formed in the semiconductor substrate 2211. Note that here is illustrated an example in which the semiconductor substrate 2211 includes a protruding portion; however, the semiconductor device of one embodiment of the present invention is not limited thereto. For example, a semiconductor region including a protruding portion may be formed by processing an SOI substrate.

[Examples of Circuit Configuration]

In the above structure, electrodes of the transistors 2100 and 2200 can be connected in a variety of ways; thus, a variety of circuits can be formed. Examples of a circuit configuration which can be achieved by using the semiconductor device of one embodiment of the present invention are shown below.

Figure 22B:
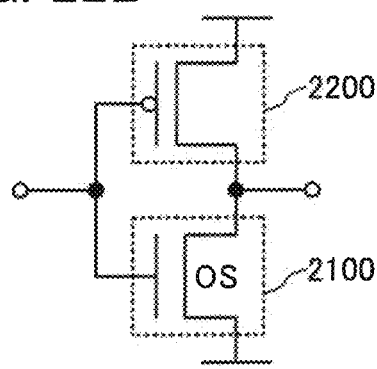

A circuit diagram in FIG. 22B shows a configuration of a "CMOS circuit" in which the p-channel transistor 2200 and the n-channel transistor 2100 are connected to each other in series and in which gates of them are connected to each other.

Figure 22C:
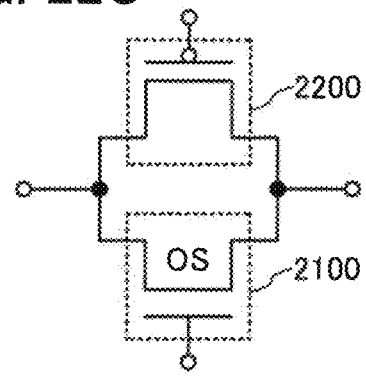
Figure 22D:
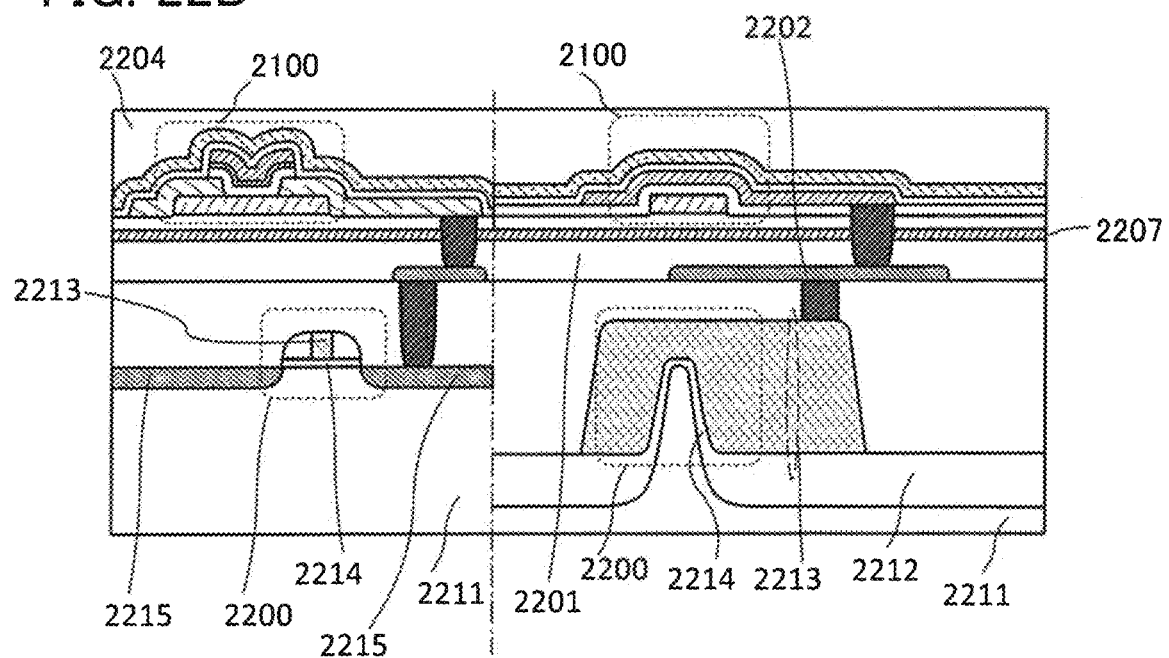

A circuit diagram in FIG. 22C shows a configuration in which a source and a drain of the transistor 2100 are connected to a source and a drain of the transistor 2200. With such a configuration, the transistors can function as a so-called analog switch.

Figure 23:
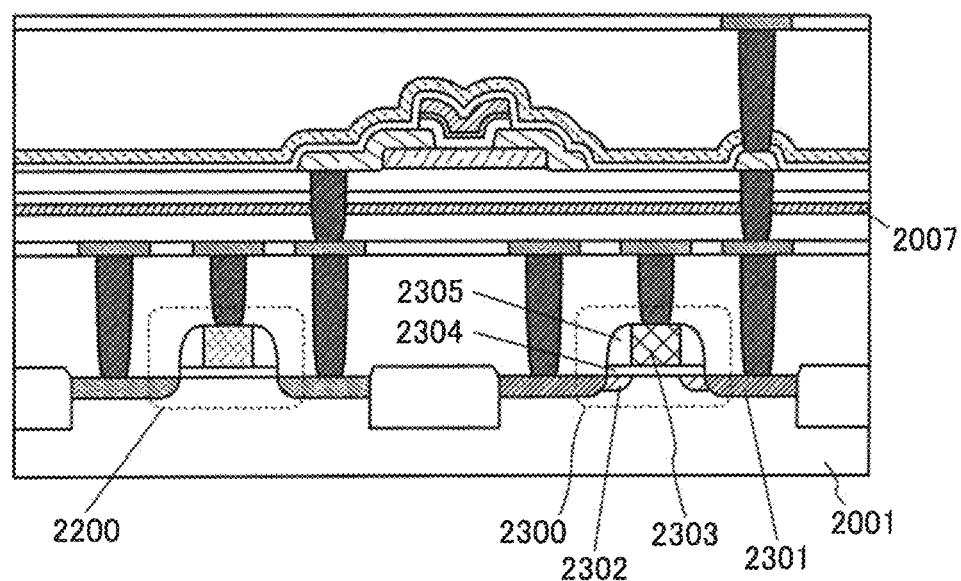
FIG. 23 is a cross-sectional view illustrating one embodiment of a semiconductor device.

FIG. 23 is a cross-sectional view of a semiconductor device in which a CMOS circuit is formed using the transistor 2200 and a transistor 2300 each including a channel formed using the first semiconductor material.

The transistor 2300 includes impurity regions 2301 serving as source and drain regions, a gate electrode 2303, a gate insulating film 2304, and a sidewall insulating film 2305. The transistor 2300 may also include an impurity region 2302 serving as an LDD region under the sidewall insulating film 2305. The description for FIG. 22A can be referred to for other components in FIG. 23.

The transistors 2200 and 2300 preferably have opposite polarities. For example, when the transistor 2200 is a p-channel transistor, the transistor 2300 is preferably an n-channel transistor.

A photoelectric conversion element, such as a photodiode, may be provided in the semiconductor devices illustrated in FIG. 22A and FIG. 23.

The photodiode can be formed using a single crystal semiconductor or a polycrystalline semiconductor. The photodiode formed using a single crystal semiconductor or a polycrystalline semiconductor is preferable because of its high light detection sensitivity.

Figure 24A:
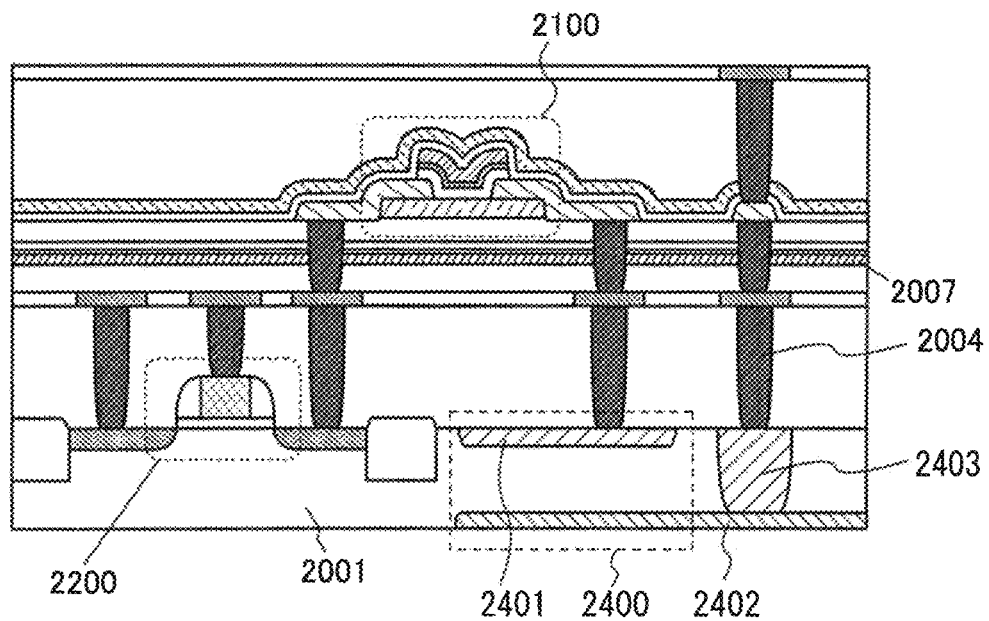
FIGS. 24A and 24B are cross-sectional views each illustrating one embodiment of a semiconductor device.

FIG. 24A is a cross-sectional view of a semiconductor device in which a substrate 2001 is provided with a photodiode 2400. The photodiode 2400 includes a conductive film 2401 having a function as one of an anode and a cathode, a conductive film 2402 having a function as the other of the anode and the cathode, and a conductive film 2403 electrically connecting the conductive film 2402 and a plug 2004. The conductive films 2401 to 2403 may be formed by injecting an impurity into the substrate 2001.

Although the photodiode 2400 is provided so that a current flows in the vertical direction with respect to the substrate 2001 in FIG. 24A, the photodiode 2400 may be provided so that a current flows in the lateral direction with respect to the substrate 2001.

Figure 24B:
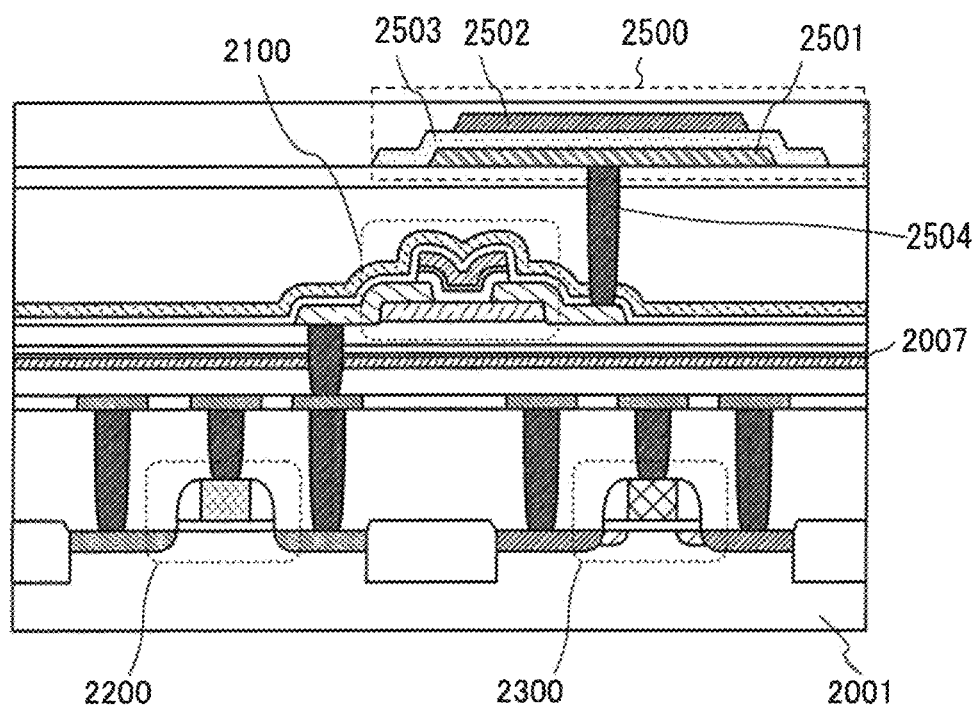

FIG. 24B is a cross-sectional view of a semiconductor device in which a photodiode 2500 is provided over the transistor 2100. The photodiode 2500 includes a conductive film 2501 having a function as one of an anode and a cathode, a conductive film 2502 having a function as the other of the anode and the cathode, and a semiconductor layer 2503. The photodiode 2500 is electrically connected to the transistor 2100 through a plug 2504.

In FIG. 24B, the photodiode 2500 may also be provided at the same level as the transistor 2100. Alternatively, the photodiode 2500 may also be provided at the level between the transistor 2200 and the transistor 2100.

The description for FIG. 22A and FIG. 23 can be referred to for the details of other components in FIGS. 24A and 24B.

The photodiode 2400 or the photodiode 2500 may be formed using a material capable of generating charge by absorbing a radiation. Examples of a material capable of generating charge by absorbing a radiation include selenium, lead iodide, mercury iodide, gallium arsenide, CdTe, and CdZn.

The use of selenium for the photodiode 2400 or the photodiode 2500 can provide a photoelectric conversion element having a light absorption coefficient in a wide wavelength range of visible light, ultraviolet light, X-rays, and gamma rays, for example.

<Memory Device>

Figure 25:
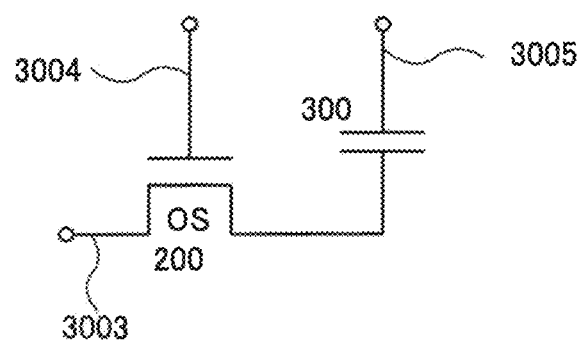
FIG. 25 is a circuit diagram of one embodiment of a semiconductor device.

An example of a semiconductor device (memory device) which includes the transistor of one embodiment of the present invention, which can hold stored data even when not powered, and which has an unlimited number of write cycles is illustrated in FIG. 25.

A semiconductor device illustrated in FIG. 25 is different from the memory device described in Embodiment 1 in that the transistor 100 is not provided. Also in that case, writing and holding of data can be performed in a manner similar to the above.

Next, reading of data in the semiconductor device shown in FIG. 25 is described. When a transistor 200 is turned on, a wiring 3003 which is in a floating state and a capacitor 300 are electrically connected to each other, and charge is redistributed between the wiring 3003 and the capacitor 300. As a result, the potential of the wiring 3003 is changed. The amount of change in potential of the wiring 3003 varies depending on the potential of one electrode of the capacitor 300 (or charge accumulated in the capacitor 300).

For example, the potential of the wiring 3003 after the charge redistribution is $(C_B \times V_{B0} + C \times V)/(C_B + C)$, where V is the potential of the one electrode of the capacitor 300, C is the capacitance of the capacitor 300, $C_B$ is the capacitance component of the wiring 3003, and $V_{B0}$ is the potential of the wiring 3003 before the charge redistribution. Thus, it can be found that, assuming that a memory cell is in either of two states in which the potential of the one electrode of the capacitor 300 is $V_1$ and $V_0$ ($V_1 > V_0$), the potential of the wiring 3003 in the case of holding the potential $V_1$ (=$(C_B \times V_{B0} + C \times V_1)/(C_B + C)$) is higher than the potential of the wiring 3003 in the case of holding the potential $V_0$ (=$(C_B \times V_{B0} + C \times V_0)/(C_B + C)$).

Then, by comparing the potential of the wiring 3003 with a predetermined potential, data can be read.

In that case, a transistor including a first semiconductor material may be used for a driver circuit for driving the memory cell, and a transistor including a second semiconductor material may be stacked over the driver circuit as the transistor 200.

When a transistor including a channel formation region formed using an oxide semiconductor and having an extremely small off-state current is applied to the semiconductor device in this embodiment, the semiconductor device can hold stored data for an extremely long time. In other words, power consumption can be sufficiently reduced because the refresh operation becomes unnecessary or the frequency of refresh operations can be extremely low. Moreover, stored data can be held for a long time even when power is not supplied (note that a potential is preferably fixed).

Furthermore, in the semiconductor device described in this embodiment, high voltage is not needed for writing data and there is no problem, such as deterioration of elements. For example, unlike a conventional nonvolatile memory, it is not necessary to inject and extract electrons into and from a floating gate, and thus, a problem, such as deterioration of a gate insulating film, does not arise at all. In other words, the semiconductor device of one embodiment of the disclosed invention does not have a limit on the number of times of writing, which is a problem in a conventional nonvolatile memory, and reliability thereof is drastically improved. Furthermore, data is written depending on the on state and the off state of the transistor, whereby high-speed operation can be easily achieved.

The memory device described in this embodiment can also be used in an LSI, such as a central processing unit (CPU), a digital signal processor (DSP), a custom LSI, or a programmable logic device (PLD) and a radio frequency identification (RF-ID) tag, for example.

The structures, the methods, and the like described in this embodiment can be combined as appropriate with any of the structures, the methods, and the like described in the other embodiments.

Embodiment 5

In this embodiment, an RF device tag that includes any of the transistors and the memory devices described in the above embodiments will be described with reference to FIG. 26.

The RF device tag of this embodiment includes a memory circuit, stores necessary data for the memory circuit, and transmits and receives data to and from the outside by using contactless means, for example, wireless communication. With these features, the RF device tag can be used for an individual authentication system in which an object or the like is recognized by reading its individual information, for example. In order that the RF device tag is used for such application, extremely high reliability is needed.

The configuration of the RF device tag is described with reference to FIG. 26. FIG. 26 is a block diagram showing a configuration example of the RF device tag.

Figure 26:
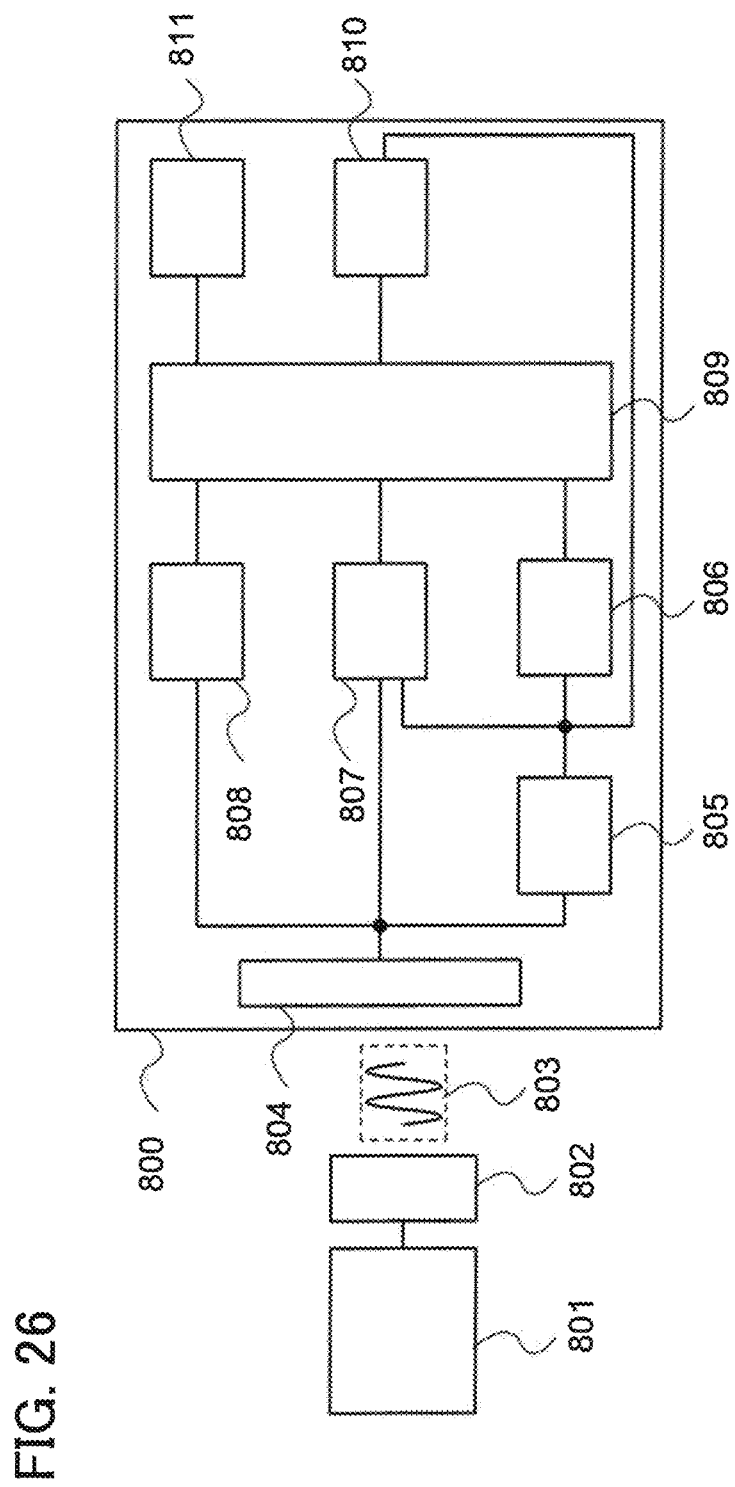
FIG. 26 shows a structural example of an RF device tag of one embodiment.

As shown in FIG. 26, an RF device tag 800 includes an antenna 804 that receives a radio signal 803 that is transmitted from an antenna 802 connected to a communication device 801 (also referred to as an interrogator, a reader/writer, or the like). The RF device tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be small enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method by which a pair of coils is provided so as to face each other and communicates with each other by mutual induction, an electromagnetic induction method by which communication is performed using an induction field, and an electric wave method by which communication is performed using an electric wave. Any of these methods can be used in the RF device tag 800 described in this embodiment.

Next, the configuration of each circuit is described. The antenna 804 exchanges the radio signal 803 with the antenna 802 that is connected to the communication device 801. The rectifier circuit 805 generates an input potential by rectification, for example, half-wave voltage doubler rectification, of an input alternating signal generated by reception of a radio signal at the antenna 804 and smoothing of the rectified signal with a capacitor provided in a later stage. Note that a limiter circuit may be provided on an input side or an output side of the rectifier circuit 805. The limiter circuit controls power so that power which is higher than or equal to a certain power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates a demodulated signal. Furthermore, the modulation circuit 808 performs modulation in accordance with data output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that whether each circuit as described above is provided can be determined as appropriate and as needed.

Any of the memory devices described in the above embodiments can be used for the memory circuit 810. Since the memory device of one embodiment of the present invention can hold data even when not powered, the memory device can be favorably used for the RF device tag. In addition, the memory device of one embodiment of the present invention needs much less power (voltage) for data writing than a conventional nonvolatile memory; thus, it is possible to prevent a difference between the maximum communication range in data reading and that in data writing. Furthermore, it is possible to suppress malfunction or incorrect writing which is caused by power shortage in data writing.

Since the memory device of one embodiment of the present invention can be used for a nonvolatile memory, it can also be used for the ROM 811. In that case, it is preferable that a manufacturer separately prepare a command for writing data to the ROM 811 so that a user cannot rewrite data freely. The manufacturer gives identification numbers before shipment and then starts shipment of products, instead of putting identification numbers to all the manufactured RF device tags; thus, it is possible to put identification numbers only to good products to be shipped. Therefore, the identification numbers of the shipped products are in series and customer management corresponding to the shipped products is easily performed.

At least part of this embodiment can be implemented in combination with any of the other embodiments described in this specification as appropriate.

Embodiment 6

In this embodiment, a CPU will be described, which includes at least any of the transistors described in the above embodiments and any of the memory devices described in the above embodiments.

Figure 27:
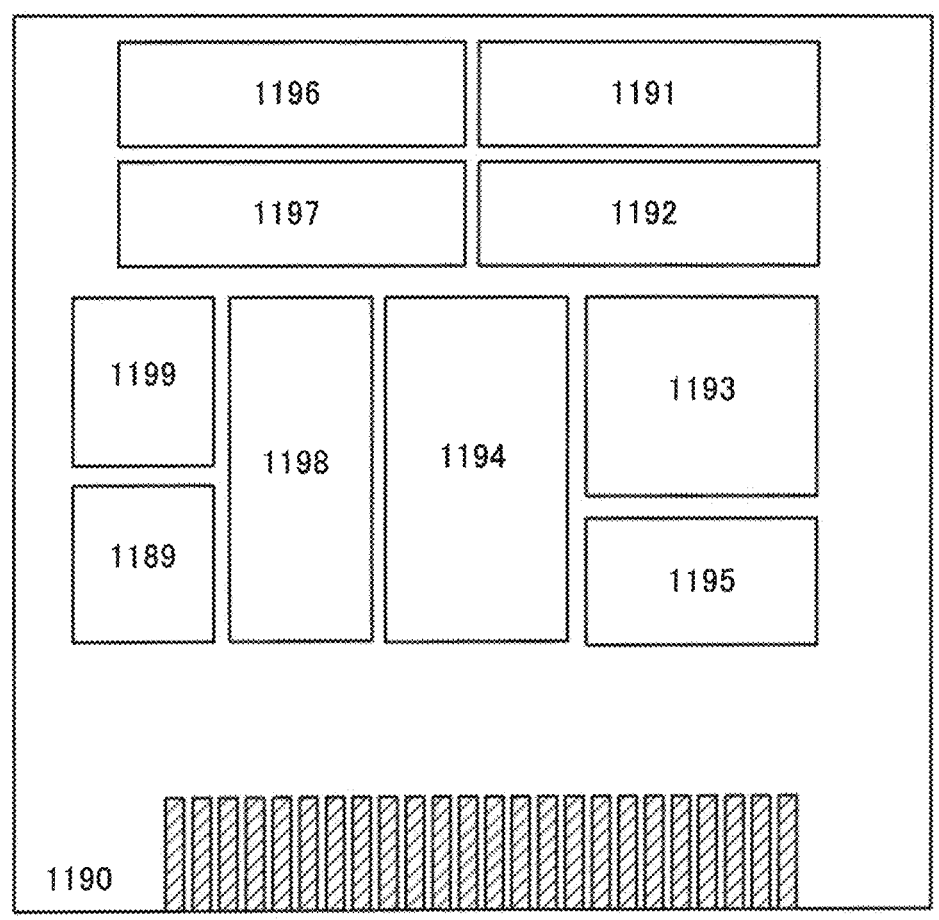
FIG. 27 shows a structural example of a CPU of one embodiment.

FIG. 27 is a block diagram showing a configuration example of a CPU which includes at least any of the transistors described in the above embodiments as a component.

The CPU shown in FIG. 27 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may each be provided over a separate chip. Needless to say, the CPU shown in FIG. 27 is just an example with a simplified configuration, and an actual CPU may have a variety of configurations depending on the application. For example, the CPU may have the following configuration: a structure including the CPU shown in FIG. 27 or an arithmetic circuit is considered as one core, a plurality of the cores are included, and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 perform various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196 and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1 and supplies the internal clock signal CLK2 to the above circuits.

In the CPU shown in FIG. 27, a memory cell is provided in the register 1196. For the memory cell of the register 1196, any of the transistors described in the above embodiments can be used.

In the CPU shown in FIG. 27, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of a power supply voltage to the memory cell in the register 1196 can be stopped.

Figure 28:
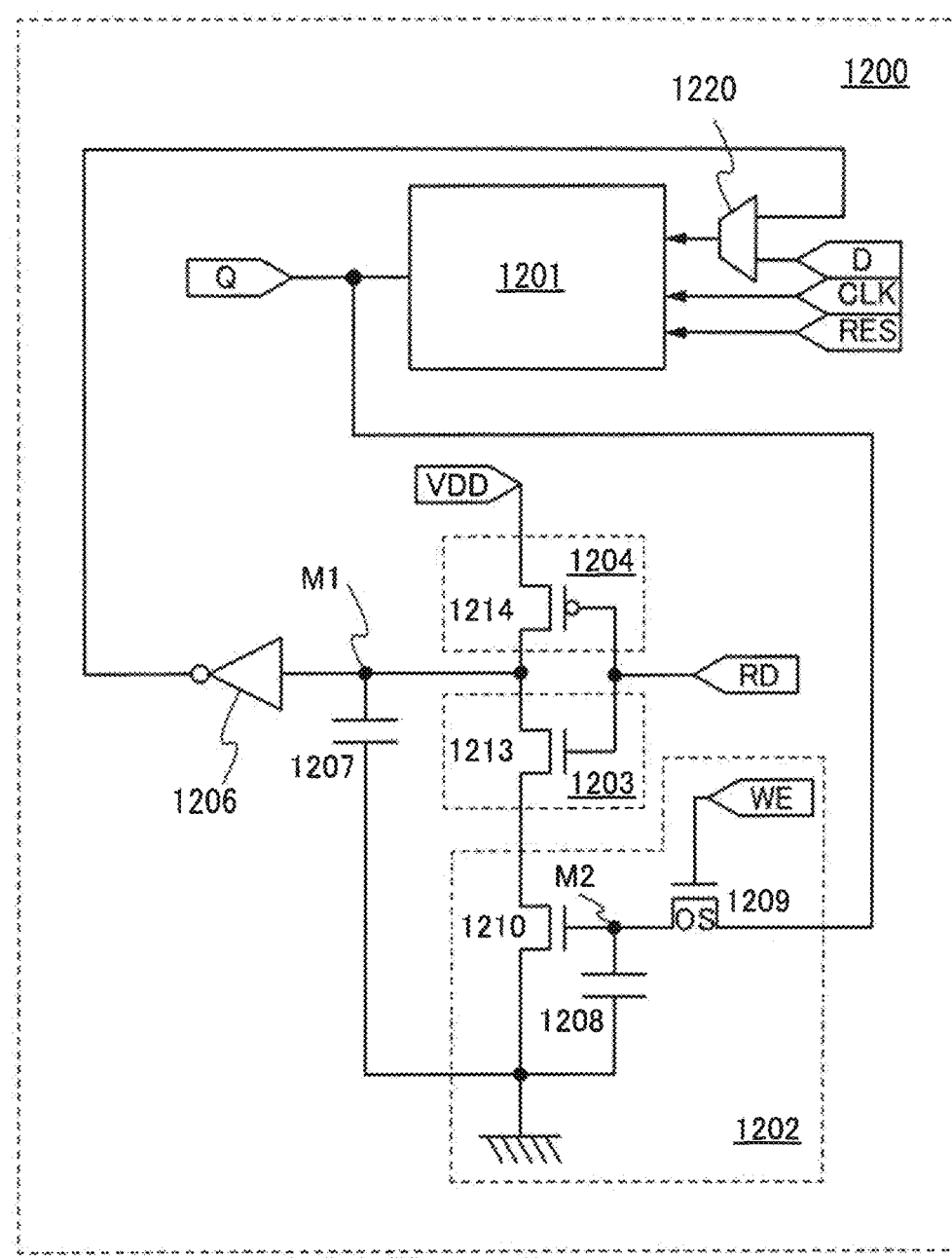
FIG. 28 is a circuit diagram of a memory element of one embodiment.

FIG. 28 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element, such as a diode, a resistor, or an inductor, as necessary.

Any of the memory devices described in the above embodiments can be used as the circuit 1202. When supply of a power supply voltage to the memory element 1200 is stopped, a ground potential (0 V) or a potential at which the transistor 1209 in the circuit 1202 is turned off continues to be input to a gate electrode of the transistor 1209. For example, the gate electrode of the transistor 1209 is grounded through a load, such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source electrode and a drain electrode of the transistor 1213, a second terminal of the switch 1203 corresponds to the other of the source electrode and the drain electrode of the transistor 1213, and conduction or non-conduction between the first terminal and the second terminal of the switch 1203 (i.e., the on/off state of the transistor 1213) is selected by a control signal RD input to a gate electrode of the transistor 1213. A first terminal of the switch 1204 corresponds to one of a source electrode and a drain electrode of the transistor 1214, a second terminal of the switch 1204 corresponds to the other of the source electrode and the drain electrode of the transistor 1214, and conduction or non-conduction between the first terminal and the second terminal of the switch 1204 (i.e., the on/off state of the transistor 1214) is selected by the control signal RD input to a gate electrode of the transistor 1214.

One of a source electrode and a drain electrode of the transistor 1209 is electrically connected to one of a pair of electrodes of the capacitor 1208 and a gate electrode of the transistor 1210. Here, the connection portion is referred to as a node M2. One of a source electrode and a drain electrode of the transistor 1210 is electrically connected to a wiring which can supply a low power supply potential (e.g., a GND line), and the other thereof is electrically connected to the first terminal of the switch 1203 (the one of the source electrode and the drain electrode of the transistor 1213). The second terminal of the switch 1203 (the other of the source electrode and the drain electrode of the transistor 1213) is electrically connected to the first terminal of the switch 1204 (the one of the source electrode and the drain electrode of the transistor 1214). The second terminal of the switch 1204 (the other of the source electrode and the drain electrode of the transistor 1214) is electrically connected to a wiring which can supply a power supply potential VDD. The second terminal of the switch 1203 (the other of the source electrode and the drain electrode of the transistor 1213), the first terminal of the switch 1204 (the one of the source electrode and the drain electrode of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring which can supply a low power supply potential (e.g., the GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring which can supply a low power supply potential (e.g., the GND line).

The capacitor 1207 and the capacitor 1208 are not necessarily provided when the parasitic capacitance or the like of the transistor or the wiring is utilized.

A control signal WE is input to a first gate electrode of the transistor 1209. As for each of the switch 1203 and the switch 1204, a conduction state or a non-conduction state between the first terminal and the second terminal is selected by the control signal RD which is different from the control signal WE. When one of the switches is in the conduction state between the first terminal and the second terminal, the other of the switches is in the non-conduction state between the first terminal and the second terminal.

A signal corresponding to data held in the circuit 1201 is input to the other of the source electrode and the drain electrode of the transistor 1209. FIG. 28 shows an example in which a signal output from the circuit 1201 is input to the other of the source electrode and the drain electrode of the transistor 1209. The logic value of a signal output from the second terminal of the switch 1203 (the other of the source electrode and the drain electrode of the transistor 1213) is inverted by the logic element 1206, and the inverted signal is input to the circuit 1201 through the circuit 1220.

In FIG. 28, a signal output from the second terminal of the switch 1203 (the other of the source electrode and the drain electrode of the transistor 1213) is input to the circuit 1201 through the logic element 1206 and the circuit 1220; however, one embodiment of the present invention is not limited thereto. The signal output from the second terminal of the switch 1203 (the other of the source electrode and the drain electrode of the transistor 1213) may be input to the circuit 1201 without its logic value being inverted. For example, in the case where the circuit 1201 includes a node at which a signal obtained by inverting the logic value of a signal input from the input terminal is held, the signal output from the second terminal of the switch 1203 (the other of the source electrode and the drain electrode of the transistor 1213) can be input to the node.

In FIG. 28, the transistors included in the memory element 1200 except for the transistor 1209 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, all the transistors in the memory element 1200 may each be a transistor in which a channel is formed in an oxide semiconductor film. Further alternatively, the memory element 1200 may include, besides the transistor 1209, a transistor in which a channel is formed in an oxide semiconductor film; for the other transistors, a transistor in which a channel is formed in a layer formed using a semiconductor other than an oxide semiconductor or in the substrate 1190 can be used.

As the circuit 1201 shown in FIG. 28, for example, a flip-flop circuit can be used. As the logic element 1206, for example, an inverter or a clocked inverter can be used.

In the semiconductor device of one embodiment of the present invention, in a period during which the memory element 1200 is not supplied with a power supply voltage, data stored in the circuit 1201 can be held by the capacitor 1208 which is provided in the circuit 1202.

The off-state current of a transistor in which a channel is formed in an oxide semiconductor film is extremely small. For example, the off-state current of a transistor in which a channel is formed in an oxide semiconductor film is much smaller than that of a transistor in which a channel is formed in silicon having crystallinity. Thus, when the transistor is used as the transistor 1209, a signal held in the capacitor 1208 is held for a long time also in a period during which a power supply voltage is not supplied to the memory element 1200. The memory element 1200 can accordingly hold the stored content (data) also in a period during which the supply of a power supply voltage is stopped.

Since the above-described memory element performs pre-charge operation with the switch 1203 and the switch 1204, the time required for the circuit 1201 to hold original data again after the supply of a power supply voltage is restarted can be shortened.

In the circuit 1202, a signal held by the capacitor 1208 is input to the gate electrode of the transistor 1210. Therefore, after the supply of a power supply voltage to the memory element 1200 is restarted, the signal held by the capacitor 1208 can be converted into the one corresponding to the state (the on state or the off state) of the transistor 1210 to be read from the circuit 1202. Consequently, an original signal can be accurately read even when the potential corresponding to the signal held by the capacitor 1208 varies to some degree.

By applying the above-described memory element 1200 to a memory device, such as a register or a cache memory, included in a processor, data in the memory device can be prevented from being lost owing to the stop of the supply of a power supply voltage.

Furthermore, shortly after the supply of a power supply voltage is restarted, the memory can be returned to the state before the stop of the power supply. Therefore, the power supply can be stopped even for a short time in the processor or one or a plurality of logic circuits included in the processor. Accordingly, power consumption can be suppressed.

Although the memory element 1200 is used in a CPU in this embodiment, the memory element 1200 can also be used in an LSI, such as a digital signal processor (DSP), a custom LSI, or a programmable logic device (PLD), and a radio frequency identification (RF-ID) tag.

At least part of this embodiment can be implemented in combination with any of the other embodiments described in this specification as appropriate.

Embodiment 7

In this embodiment, a display device of one embodiment of the present invention will be described with reference to FIGS. 29A to 29C and FIGS. 30A and 30B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by current or voltage and specifically includes, in its category, an inorganic electroluminescent (EL) element, an organic EL element, and the like. A display device including an EL element (an EL display device) and a display device including a liquid crystal element (a liquid crystal display device) are described below as examples of the display device.

Note that the display device described below includes, in its category, a panel in which a display element is sealed and a module in which an IC, such as a controller, or the like is mounted on the panel.

The display device described below refers to an image display device or a light source (including a lighting device). The display device includes, in its category, any of the following modules: a module provided with a connector, such as an FPC or TCP, a module in which a printed wiring board is provided at the end of TCP, and a module in which an integrated circuit (IC) is mounted directly on a display element by a COG method.

Figure 29A:
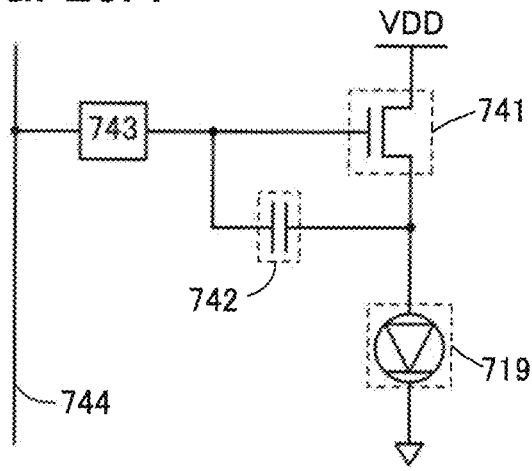
FIG. 29A is a circuit diagram.
Figure 29B:
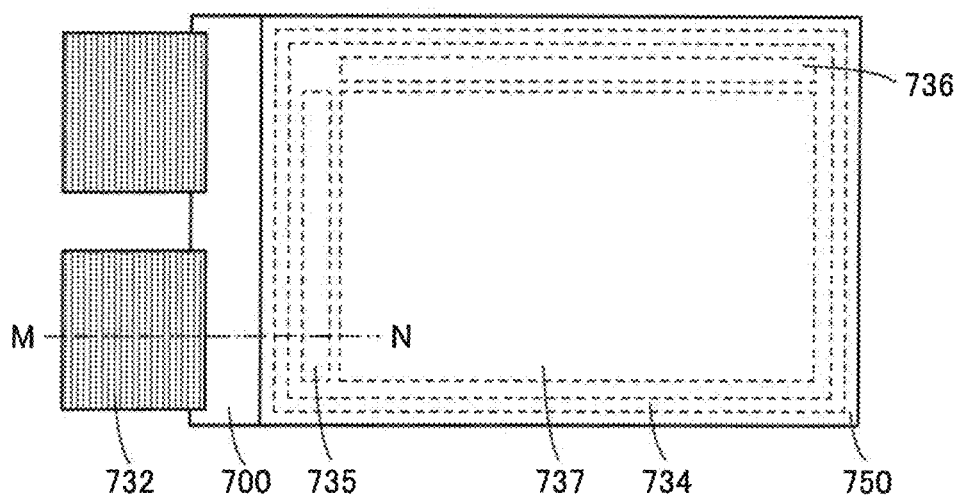
FIG. 29B is a top view.
Figure 29C:
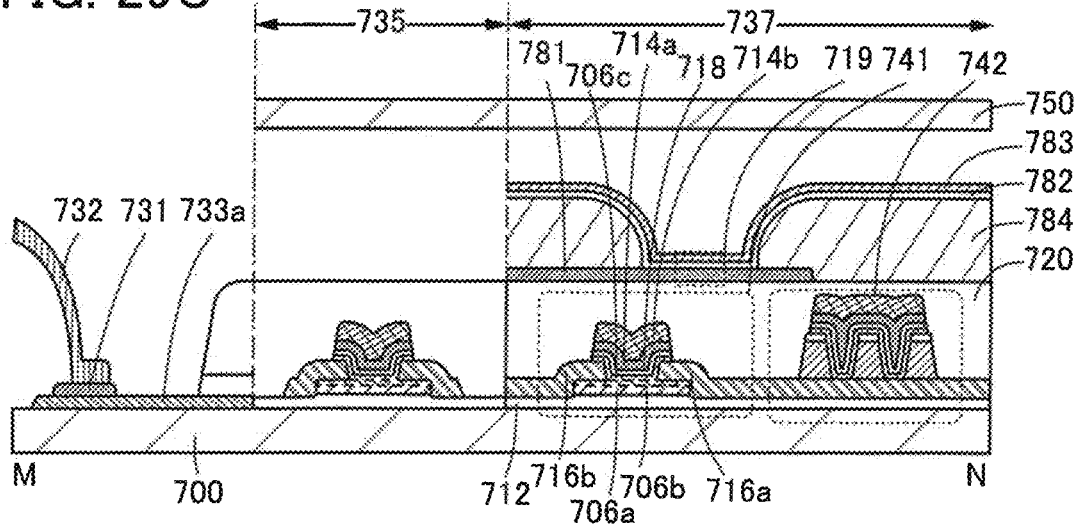
FIG. 29C is a cross-sectional view of a display device of one embodiment.

FIGS. 29A to 29C illustrate an example of an EL display device of one embodiment of the present invention. FIG. 29A is a circuit diagram of a pixel in the EL display device. FIG. 29B is a top view illustrating the whole EL display device. FIG. 29C is a cross-sectional view taken along part of dashed-dotted line M-N in FIG. 29B.

FIG. 29A shows an example of a circuit diagram of a pixel used in the EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like. Particularly in the case where the number of portions to which a terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least a connection portion of a circuit is specified.

Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Alternatively, when a connection portion of a circuit is specified, the circuit is disclosed as one embodiment of the invention even when its function is not specified, and one embodiment of the invention can be constituted. Alternatively, when a function of a circuit is specified, the circuit is disclosed as one embodiment of the invention even when its connection portion is not specified, and one embodiment of the invention can be constituted.

The EL display device shown in FIG. 29A includes a switching element 743, a transistor 741, a capacitor 742, and a light-emitting element 719.

FIG. 29A shows one example of a circuit configuration; therefore, a transistor can be provided additionally. In contrast, for each node in FIG. 29A, it is possible not to provide an additional transistor, switch, passive element, or the like.

A gate electrode of the transistor 741 is electrically connected to a first terminal of the switching element 743 and one electrode of the capacitor 742. A source electrode of the transistor 741 is electrically connected to the other electrode of the capacitor 742 and one electrode of the light-emitting element 719. A power supply potential VDD is supplied to a drain electrode of the transistor 741. A second terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of the pixel can be reduced, so that the EL display device can have high resolution. As the switching element 743, a transistor formed through the same process as the transistor 741 can be used, so that the EL display device can be manufactured with high productivity. Note that as the transistor 741 and/or the switching element 743, any of the above-described transistors can be used, for example.

FIG. 29B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 29C is a cross-sectional view of the EL display device taken along part of dashed-dotted line M-N in FIG. 29B.

FIG. 29C illustrates the structure of the transistor 741 including an insulator 712 over the substrate 700, semiconductors 706a and 706b over the insulator 712, conductors 716a and 716b in contact with the semiconductors 706a and 706b, a semiconductor 706c and an insulator 718 over the semiconductor 706b and the conductor 716a and 716b, and conductors 714a and 714b that are provided over the insulator 718 and overlap with the semiconductor 706c. Note that the structure of the transistor 741 is just an example; the transistor 741 may have a structure different from that illustrated in FIG. 29C.

In the transistor 741 illustrated in FIG. 29C, the conductors 714a and 714b serve as a gate electrode, the insulator 718 serves as a gate insulator, the conductor 716a serves as a source electrode, and the conductor 716b serves as a drain electrode.

In FIG. 29C, a capacitor having a structure similar to that of the capacitor 300, which is described in the above embodiment and is a three-dimensional capacitor, can be used as the capacitor 742. Accordingly, the capacitance of the capacitor per projected area can be increased, leading to a smaller area, higher integration, and miniaturization of the EL display device.

The capacitor 742 can be formed using a film that is also used for the transistor 741. The conductor 716a and a first electrode of the capacitor 742 are preferably formed using the same kind of conductor, in which case the conductor 716a and the first electrode of the capacitor 742 can be formed through the same step. The conductors 714a and 714b and a second electrode of the capacitor 742 are preferably formed using the same kind of conductor, in which case the conductors 714a and 714b and the second electrode of the capacitor 742 can be formed through the same step.

The capacitor 742 illustrated in FIG. 29C has a large capacitance per area. Therefore, the EL display device illustrated in FIG. 29C has high display quality.

An insulator 720 is provided over the transistor 741 and the capacitor 742. The insulator 720 may have an opening reaching the conductor 716a that serves as a source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 in the opening provided in the partition wall 784 is provided over the partition wall 784. A conductor 783 is provided over the light-emitting layer 782. A region where the conductor 781, the light-emitting layer 782, and the conductor 783 overlap with each other serves as the light-emitting element 719.

So far, an example of the EL display device has been described. Next, an example of a liquid crystal display device is described.

Figure 30A:
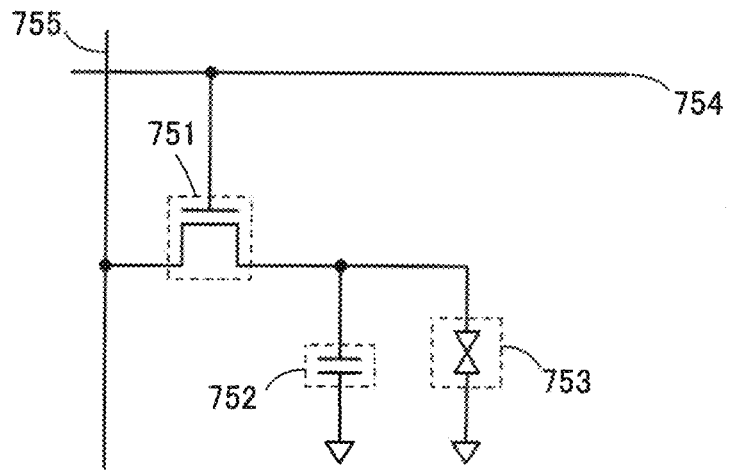
FIG. 30A is a circuit diagram and FIG. 30B is a cross-sectional view of a display device of one embodiment.

FIG. 30A is a circuit diagram showing a configuration example of a pixel of a liquid crystal display device. A pixel illustrated in FIGS. 30A and 30B includes a transistor 751, a capacitor 752, and an element (liquid crystal element) 753 in which a space between a pair of electrodes is filled with a liquid crystal.

One of a source electrode and a drain electrode of the transistor 751 is electrically connected to a signal line 755, and a gate electrode of the transistor 751 is electrically connected to a scan line 754.

One electrode of the capacitor 752 is electrically connected to the other of the source electrode and the drain electrode of the transistor 751, and the other electrode of the capacitor 752 is electrically connected to a wiring for supplying a common potential.

One electrode of the liquid crystal element 753 is electrically connected to the other of the source electrode and the drain electrode of the transistor 751, and the other electrode of the liquid crystal element 753 is electrically connected to a wiring for supplying a common potential. The common potential supplied to the wiring electrically connected to the other electrode of the capacitor 752 may be different from that supplied to the wiring electrically connected to the other electrode of the liquid crystal element 753.

Figure 30B:
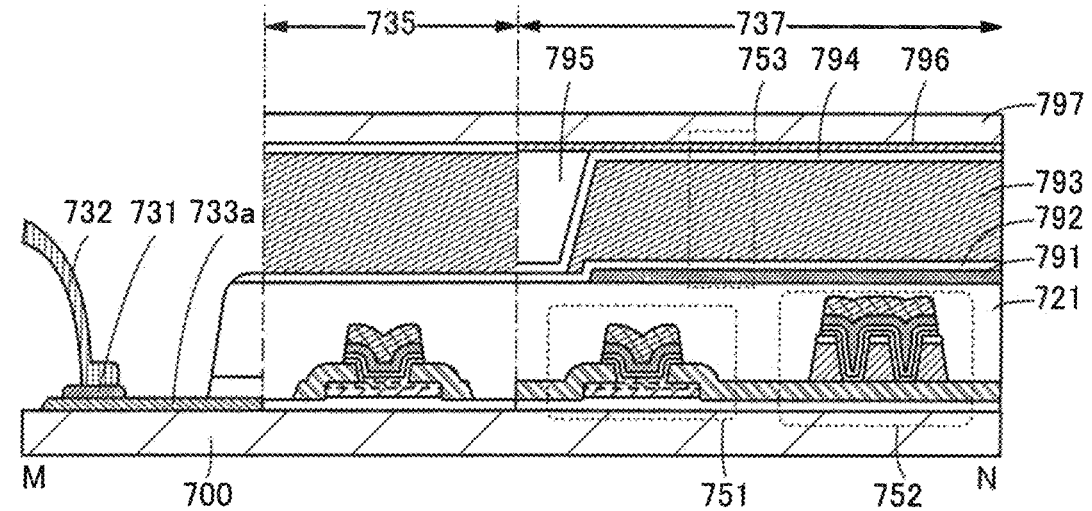

Note that the description of the liquid crystal display device is made on the assumption that the top view of the liquid crystal display device is similar to that of the EL display device. FIG. 30B is a cross-sectional view of the liquid crystal display device taken along dashed-dotted line M-N in FIG. 29B. In FIG. 30B, an FPC 732 is connected to a wiring 733a through a terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 30B corresponds to, but is not limited to, the structure of the capacitor 742 in FIG. 29C.

Note that in the case where an oxide semiconductor is used as the semiconductor of the transistor 751, the off-state current of the transistor 751 can be extremely small. Therefore, charge held in the capacitor 752 is unlikely to leak, so that the voltage applied to the liquid crystal element 753 can be maintained for a long time. Accordingly, the transistor 751 can be kept off in a period during which a moving image with few motions or a still image is displayed, whereby power for the operation of the transistor 751 can be saved in that period; accordingly, a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

With the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included.

Note that examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes serve as reflective electrodes. For example, some or all of the pixel electrodes are formed to contain aluminum, silver, or the like. In such a case, a memory circuit, such as an SRAM, can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. Providing graphene or graphite as described above enables easy formation of a nitride semiconductor thereover, such as an n-type GaN semiconductor including crystals. Furthermore, a p-type GaN semiconductor including crystals or the like can be provided thereover, and the LED can be thus formed. Note that an AlN layer may be provided between the n-type GaN semiconductor including crystals and graphene or graphite. The GaN semiconductor included in the LED may be formed by MOCVD. When the graphene is provided, the GaN semiconductor included in the LED can also be formed by a sputtering method.

Embodiment 8

The semiconductor device of one embodiment of the present invention can be used for display devices, personal computers, image reproducing devices provided with recording media (typically, devices which reproduce the content of recording media, such as digital versatile discs (DVDs), and have displays for displaying the reproduced images), or the like. Other examples of an electronic device that can be equipped with the semiconductor device of one embodiment of the present invention are mobile phones, game machines including portable game consoles, portable data terminals, e-book readers, cameras, such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 31A to 31F illustrate specific examples of such electronic devices.

Figure 31A:
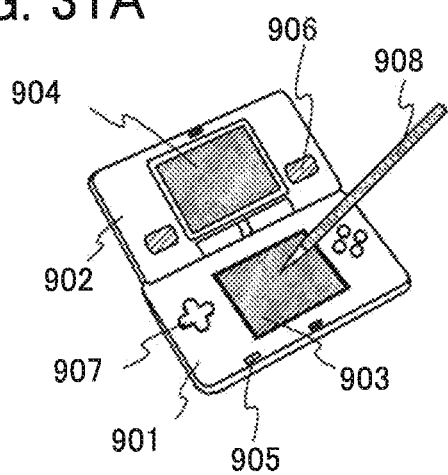
FIGS. 31A to 31F each illustrate an electronic device of one embodiment.

FIG. 31A illustrates a portable game console including a housing 901, a housing 902, a display portion 903, a display portion 904, a microphone 905, a speaker 906, an operation key 907, a stylus 908, and the like. Although the portable game console illustrated in FIG. 31A includes the two display portions 903 and 904, the number of display portions included in the portable game console is not limited thereto.

Figure 31B:
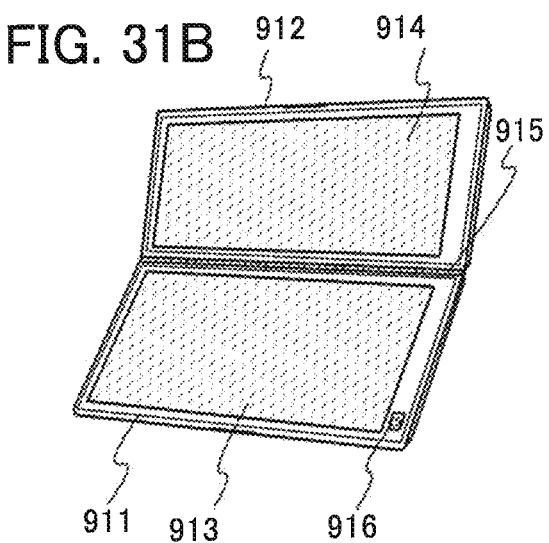

FIG. 31B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image displayed on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 31C:
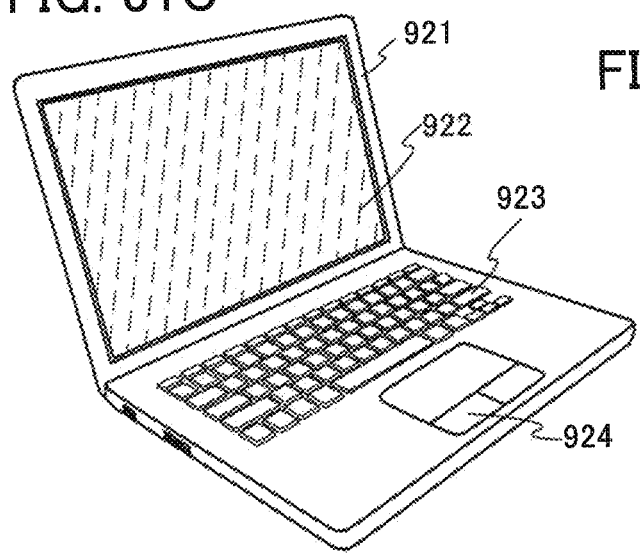

FIG. 31C illustrates a laptop personal computer including a housing 921, a display portion 922, a keyboard 923, a pointing device 924, and the like.

Figure 31D:
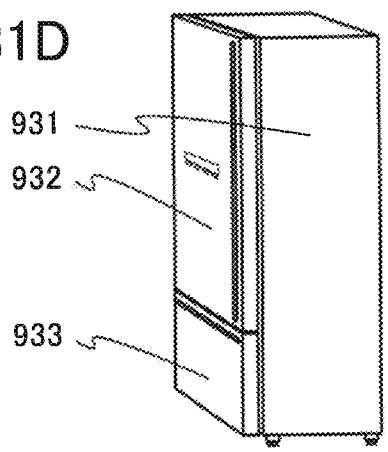

FIG. 31D illustrates an electric refrigerator-freezer including a housing 931, a refrigerator door 932, a freezer door 933, and the like.

Figure 31E:
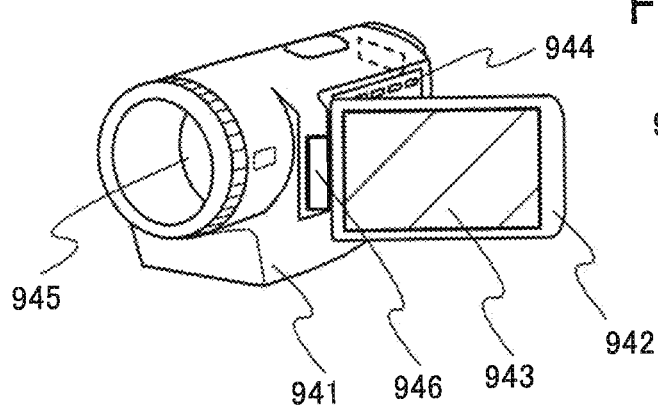

FIG. 31E illustrates a video camera including a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. An image displayed on the display portion 943 may be switched depending on the angle between the first housing 941 and the second housing 942 at the joint 946.

Figure 31F:
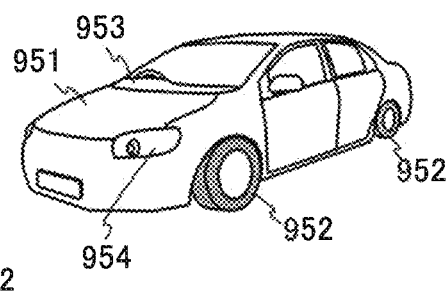
Figure 32A:
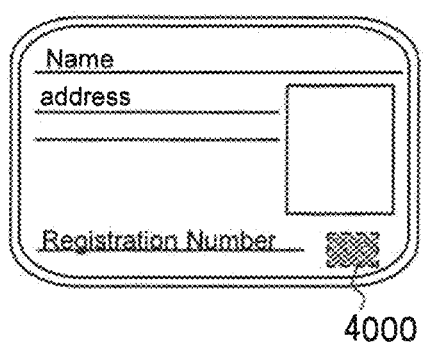
FIGS. 32A to 32F each illustrate an application example of an RF device tag of one embodiment.
Figure 32B:
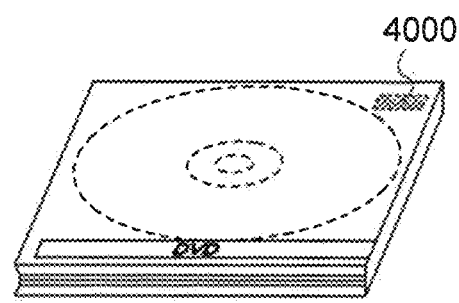
Figure 32C:
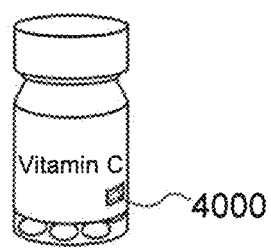
Figure 32D:
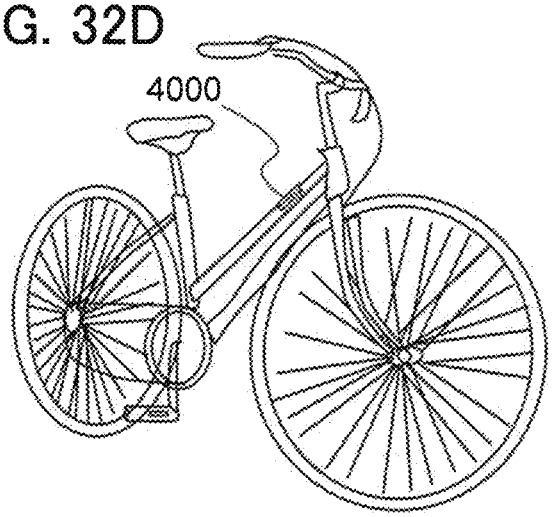
Figure 32E:
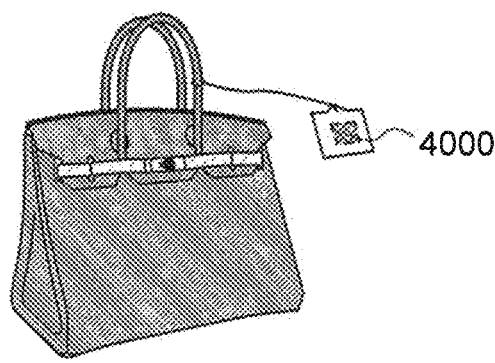
Figure 32F:
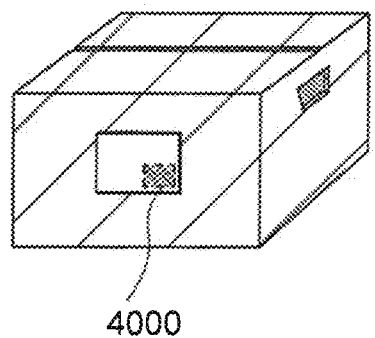

FIG. 31F illustrates a car including a car body 951, wheels 952, a dashboard 953, lights 954, and the like.

At least part of this embodiment can be implemented in combination with any of the other embodiments described in this specification as appropriate.

Embodiment 9

In this embodiment, application examples of an RF device tag of one embodiment of the present invention will be described with reference to FIGS. 32A to 32F. The RF device tag is widely used and can be provided for, for example, products, such as bills, coins, securities, bearer bonds, documents (e.g., driver's licenses or resident's cards, see FIG. 32A), recording media (e.g., DVD or video tapes, see FIG. 32B), packaging containers (e.g., wrapping paper or bottles, see FIG. 32C), vehicles (e.g., bicycles, see FIG. 32D), personal belongings (e.g., bags or glasses), foods, plants, animals, human bodies, clothing, household goods, medical supplies, such as medicine and chemicals, and electronic devices (e.g., liquid crystal display devices, EL display devices, television sets, or mobile phones), or tags on the products (see FIGS. 32E and 32F).

An RF device tag 4000 of one embodiment of the present invention is fixed to a product by being attached to a surface thereof or embedded therein. For example, the RF device tag 4000 is fixed to each product by being embedded in paper of a book, or embedded in an organic resin of a package. Since the RF device tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF device tag 4000 of one embodiment of the present invention, and the identification function can be utilized to prevent counterfeiting. Moreover, the efficiency of a system, such as an inspection system, can be improved by providing the RF device tag 4000 of one embodiment of the present invention for packaging containers, recording media, personal belongings, foods, clothing, household goods, electronic devices, or the like. Vehicles can also have higher security against theft or the like by being provided with the RF device tag 4000 of one embodiment of the present invention.

As described above, by using the RF device tag of one embodiment of the present invention for each application described in this embodiment, power for operation, such as writing or reading of data, can be reduced, which results in an increase in the maximum communication distance. Moreover, data can be held for an extremely long time even in the state where power is not supplied; thus, the RF device tag of one embodiment of the present invention can be preferably used for application in which data is not frequently written or read.

At least part of this embodiment can be implemented in combination with any of the other embodiments described in this specification as appropriate.

EXPLANATION OF REFERENCE

100: transistor, 101: semiconductor substrate, 102: semiconductor film, 103a: low-resistance layer, 103b: low-resistance layer, 104: gate insulating film, 105: gate electrode, 105a: gate electrode, 105b: gate electrode, 110: wiring, 111a: wiring, 111b: wiring, 121: insulating film, 122: insulating film, 200: transistor, 201: insulating film, 202: insulating film, 203a: oxide semiconductor layer, 203b: oxide semiconductor layer, 203c: oxide semiconductor layer, 204a: electrode, 204b: electrode, 205: gate insulating film, 206: gate electrode, 206a: conductor, 206b: conductor, 207: insulating film, 208: insulating film, 209a: low-resistance region, 209b: low-resistance region, 250: wiring, 300: capacitor, 301: insulating film, 302: electrode, 302a: conductive layer, 302A: conductive film, 302b: conductive layer, 302B: conductive film, 302C: conductive film, 302c: conductive film, 303: barrier layer, 303A: barrier film, 303B: barrier film, 304: insulator, 305: electrode, 305A: conductive film, 305a: conductor, 305b: conductor, 306: insulating film, 307: wiring, 308: wiring, 310: contact hole, 319: resist mask, 320: resist mask, 325: resist mask, 330: resist mask, 340: intermediate layer, 350: wiring, 700: substrate, 706a: semiconductor, 706b: semiconductor, 706c: semiconductor, 712: insulator, 714a: conductor, 714b: conductor, 716a: conductor, 716b: conductor, 718: insulator, 719: light-emitting element, 720: insulator, 721: insulator, 731: terminal, 732: FPC, 733a: wiring, 734: sealant, 735: driver circuit, 736: driver circuit, 737: pixel, 741: transistor, 742: capacitor, 743: switching element, 744: signal line, 750: substrate, 751: transistor, 752: capacitor, 753: liquid crystal element, 754: scan line, 755: signal line, 781: conductor, 782: light-emitting layer, 783: conductor, 784: partition wall, 791: conductor, 792: insulator, 793: liquid crystal layer, 794: insulator, 795: spacer, 796: conductor, 797: substrate, 800: RF device tag, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: refrigerator door, 933: freezer door, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2001: substrate, 2004: plug, 2100: transistor, 2200: transistor, 2201: insulating film, 2202: wiring, 2203: plug, 2204: interlayer insulating film, 2207: insulating film, 2211: semiconductor substrate, 2212: insulating film, 2213: gate electrode, 2214: gate insulating film, 2215: source and drain regions, 2300: transistor, 2301: impurity region, 2302: impurity region, 2303: gate electrode, 2304: gate insulating film, 2305: sidewall insulating film, 2400: photodiode, 2401: conductive film, 2402: conductive film, 2403: conductive film, 2500: photodiode, 2501: conductive film, 2502: conductive film, 2503: semiconductor layer, 2504: plug, 3001: wiring, 3002: wiring, 3003: wiring, 3004: wiring, 3005: wiring, 4000: RF device tag, 5100: crystal part, 5120: substrate, 5161: region This application is based on Japanese Patent Application serial no. 2014-236230 filed with Japan Patent Office on Nov. 21, 2014, the entire contents of which are hereby incorporated by reference.

The invention claimed is:

1. A semiconductor device comprising:
   a first transistor; and
   a capacitor over the first transistor,
   wherein the capacitor comprises:
      a first electrode comprising a protruding portion;
      a first insulating film over a top surface of the protruding portion;
      a second insulating film covering an entire side surface of the protruding portion, a top surface of the first insulating film, and an entire side surface of the first insulating film; and
      a second electrode over the second insulating film,
   wherein the protruding portion of the first electrode comprises a metal material or an alloy material,
   wherein a peripheral portion of the second electrode comprises a region which overlaps with the first electrode with the first insulating film and the second insulating film provided therebetween, and
   wherein the second insulating film is in direct contact with a side surface of the protruding portion of the first electrode and a top surface of the first electrode.

2. The semiconductor device according to claim 1,
   wherein a peripheral portion of the first electrode does not overlap the second electrode in top view, and
   wherein a central portion of the first electrode overlaps the second electrode in top view.

3. The semiconductor device according to claim 1, wherein the first electrode is electrically connected to the first transistor.

4. The semiconductor device according to claim 1, further comprising:
   a second transistor over the first transistor; and
   a third insulating layer between the second transistor and the first transistor, wherein the first electrode is electrically connected to the second transistor.

5. The semiconductor device according to claim 4, wherein the second transistor comprises a gate insulating film, and wherein the gate insulating film is formed by the same layer as the second insulating film.

6. The semiconductor device according to claim 4 comprising:

a metal layer comprising a first region and a second region, wherein the first region is a drain electrode of the second semiconductor, wherein the second region is the first electrode.

7. An electronic device comprising:

the semiconductor device according to claim 1; and at least one of a display device, a microphone, a speaker, an operation key, a touch panel, and an antenna.

8. A semiconductor device comprising:

a first transistor; and a capacitor over the first transistor;

wherein the capacitor comprises:

a first electrode comprising a first protruding portion and a second protruding portion;

a first insulating film over a top surface of the first protruding portion;

a second insulating film over a top surface of the second protruding portion;

a third insulating film covering an entire side surface of the first protruding portion, a top surface of the first insulating film, an entire side surface of the first insulating film, a top surface of the second insulating film, and an entire side surface of the second insulating film; and a second electrode over the third insulating film, wherein a peripheral portion of the second electrode overlaps a part of the first insulating film with the third insulating film provided therebetween, wherein the second electrode completely overlaps with the second insulating film provided with the third insulating film therebetween, and wherein the first protruding portion and the second protruding portion of the first electrode comprise a metal material or an alloy material.

9. The semiconductor device according to claim 8, wherein a peripheral portion of the first electrode does not overlap the second electrode in top view, and wherein a central portion of the first electrode overlaps the second electrode in top view.

10. The semiconductor device according to claim 8, wherein the second insulating film comprises an island shape.

11. The semiconductor device according to claim 8, wherein the second insulating film is formed in the same layer as the first insulating film.

12. The semiconductor device according to claim 8, wherein the first electrode is electrically connected to the first transistor.

13. The semiconductor device according to claim 8, further comprising:

a second transistor over the first transistor; and a forth insulating layer between the second transistor and the first transistor, wherein the first electrode is electrically connected to the second transistor.

14. The semiconductor device according to claim 13, wherein the second transistor comprises a gate insulating film, and wherein the gate insulating film is formed in the same layer as the first insulating film and the second insulating film.

15. The semiconductor device according to claim 13 comprising:

a metal layer comprising a first region and a second region, wherein the first region is a drain electrode of the second semiconductor, wherein the second region is the first electrode.

16. An electronic device comprising:

the semiconductor device according to claim 8; and at least one of a display device, a microphone, a speaker, an operation key, a touch panel, and an antenna.

* * * * *